United States Patent
Blanchard et al.

(10) Patent No.: US 12,096,567 B2
(45) Date of Patent: Sep. 17, 2024

(54) METHOD OF ASSESSING INK DEPOSITION ACCURACY IN AN ELECTRONIC DEVICE PRINTING PROCESS

(71) Applicant: SOCOVAR SOCIETE EN COMMANDITE, Québec (CA)

(72) Inventors: François Blanchard, Montréal (CA); Mariia Zhuldybina, Montréal (CA)

(73) Assignee: SOCOVAR SOCIÉTÉ EN COMMANDITE

(*) Notice: Subject to any disclaimer, the term of this patent is extended or adjusted under 35 U.S.C. 154(b) by 294 days.

(21) Appl. No.: 17/777,305

(22) PCT Filed: Nov. 23, 2020

(86) PCT No.: PCT/CA2020/051590
§ 371 (c)(1),
(2) Date: May 17, 2022

(87) PCT Pub. No.: WO2021/102558
PCT Pub. Date: Jun. 3, 2021

(65) Prior Publication Data
US 2022/0400554 A1 Dec. 15, 2022

Related U.S. Application Data

(60) Provisional application No. 62/939,850, filed on Nov. 25, 2019.

(51) Int. Cl.
*H05K 3/12* (2006.01)
*H05K 13/08* (2006.01)

(52) U.S. Cl.
CPC ............ *H05K 3/12* (2013.01); *H05K 13/081* (2018.08); *H05K 2203/163* (2013.01)

(58) Field of Classification Search
CPC .. H05K 3/12; H05K 13/081; H05K 2203/163; H05K 2203/102; H05K 1/0269
See application file for complete search history.

(56) References Cited

U.S. PATENT DOCUMENTS

2016/0107472 A1   4/2016  Garcia Juez et al.

OTHER PUBLICATIONS

Zhuldybina et al. "Contactless In Situ Electrical Characterization Method of Printed Electronic Devices with Terahertz Spectroscopy", Sensors (Basel), Jan. 2019, p. 2-11. (Year: 2019).*

(Continued)

*Primary Examiner* — Mamadou Faye
(74) *Attorney, Agent, or Firm* — Reno Lessard; Norton Rose Fulbright Canada LLP

(57) ABSTRACT

There is described a method of assessing an ink deposition accuracy in an electronic device printing process. The method generally has: printing a meta material structure on a substrate using conductive ink, the metamaterial structure having a pattern of conductive elements interspersed with complementary insulating elements, the metamaterial structure having at least a terahertz resonance frequency; emitting a terahertz radiation beam incident on the metamaterial structure of the substrate, the incident terahertz radiation beam having power at least at the terahertz resonance frequency of the metamaterial structure; the metamaterial structure interacting with said incident terahertz radiation beam resulting in an outgoing terahertz radiation beam having a spectral response at least at the terahertz resonance frequency; measuring said spectral response of said outgoing terahertz radiation beam; assessing an ink deposition accuracy of said printing based on said measured spectral response; and generating a signal based on said assessed ink deposition accuracy.

20 Claims, 21 Drawing Sheets

(56) References Cited

OTHER PUBLICATIONS

Keisuke Takano, Fumiaki Miyamaru, Koichi Akiyama, Hiroshi Miyazaki, Mitsuo W. Takeda, Yuji Abe, Yasunori Tokuda, Hiromasa Ito, and Masanori Hangyo, "Crossover from capacitive to inductive electromagnetic responses in near self-complementary metallic checkerboard patterns," Opt. Express 22, 24787-24795 (2014).

ZZhuldybina M, Ropagnol X, Trudeau C, Bolduc M, Zednik RJ, Blanchard F. Contactless In Situ Electrical Characterization Method of Printed Electronic Devices with Terahertz Spectroscopy. Sensors. 2019; 19(3):444. https://doi.org/10.3390/s19030444.

* cited by examiner

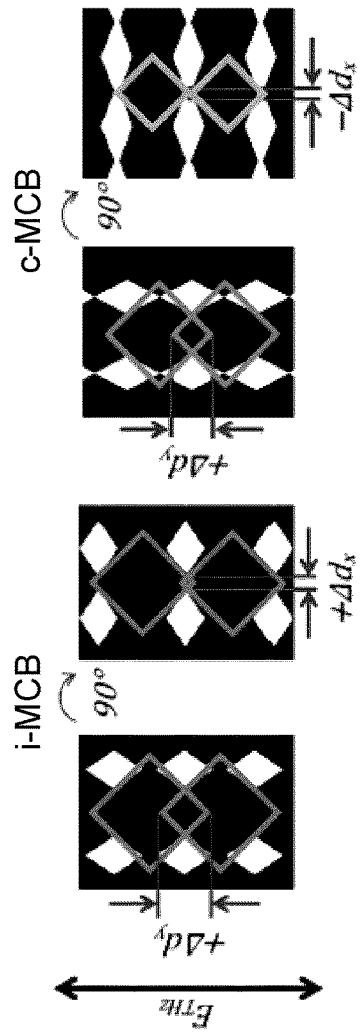
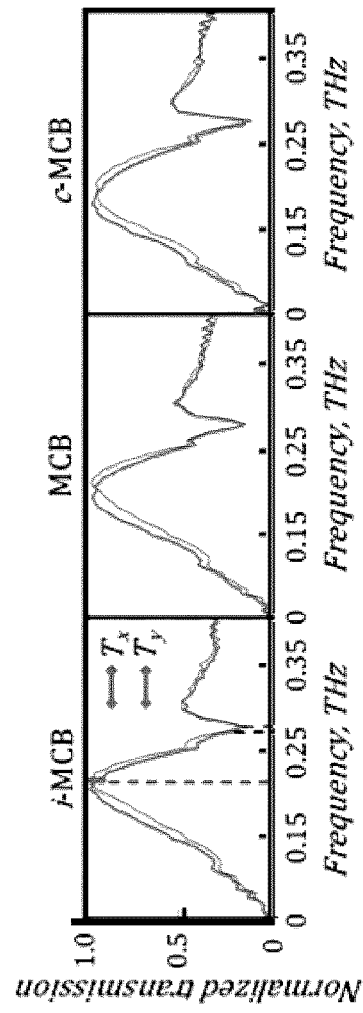
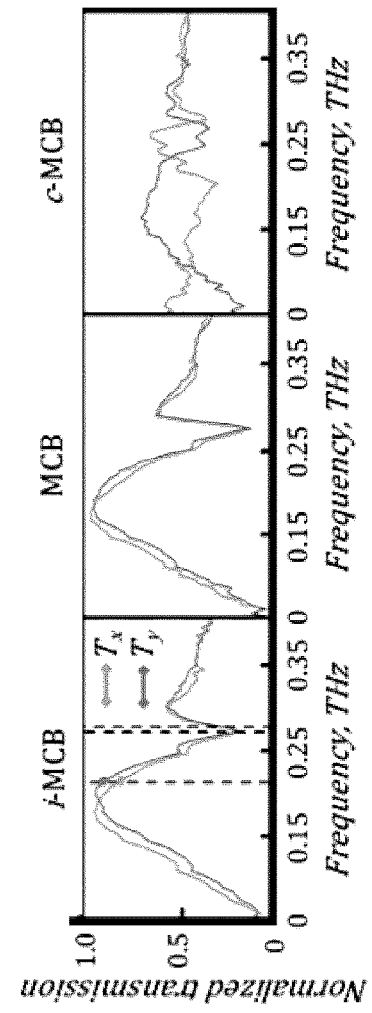
Fig. 15A
Fig. 15B
Fig. 15C

METHOD OF ASSESSING INK DEPOSITION ACCURACY IN AN ELECTRONIC DEVICE PRINTING PROCESS

FIELD

The improvements generally relate to the field of printed electronic devices and more specifically relate to the testing of such electronic devices.

BACKGROUND

Printed electronic devices are typically made from substrates on which electronic circuits are printed. As can be understood, printing of an electronic device generally involves depositing conductive ink on a substrate in a predetermined pattern to form conductive traces. The printing of such electronic circuits can be performed using conventional printing techniques suitable for defining patterns on substrates, such as screen printing, flexography, gravure, offset lithography, inkjet, and the like. Printed electronic techniques enable for low-cost fabrication and large-volume production of electronic devices for applications such as flexible displays to name only one example.

Testing the ink deposition accuracy in some or all of the electronic devices can be key in achieving a satisfactory production process. For instance, if the amount of conductive ink deposited during printing drifts over time, the operability of the resulting printed electronic devices could be negatively affected. For instance, as too much ink deposited at some places may form undesired electrical contacts, not enough ink at some other places may prevent electricity to be conducted satisfactorily. An existing technique to test the ink deposition accuracy of an electronic device printing process involves imaging the printed electronic device. However, the resolution of such images can be limited, thereby correspondingly limiting the ink deposition accuracy assessment. Although existing testing techniques are satisfactory to a certain degree, there remains room for improvement, especially in providing methods and systems which alleviate at least some drawbacks.

SUMMARY

It was found that there was a need in the industry for methods and systems which can determine ink deposition accuracy of such printing process, and more specifically methods and systems which can recognize whether too much conductive ink or not enough conductive ink was used in the printing process.

In an aspect, there is described a method of assessing an ink deposition accuracy in an electronic device printing process. The method generally has a step of printing a metamaterial structure on a substrate using conductive ink. The metamaterial structure has a pattern of conductive elements interspersed with complementary insulating elements, and a terahertz resonance frequency. The method has a step of emitting a terahertz radiation beam incident on the metamaterial structure of the substrate. As the incident terahertz radiation beam has power at least at the terahertz resonance frequency of the metamaterial structure, the metamaterial structure interacts with the incident terahertz radiation beam. The result of such an interaction is an outgoing terahertz radiation beam exhibiting a spectral response at least at the terahertz resonance frequency. The outgoing terahertz radiation beam can be a transmission of the incident terahertz radiation beam through the metamaterial structure or a reflection of the incident terahertz radiation beam off the metamaterial structure, depending on the embodiment. The method has a step of measuring the spectral response of the outgoing terahertz radiation beam, followed by a step of assessing the ink deposition accuracy of the printing based on the measured spectral response. Once assessed, the method has a step of generating a signal indicative of the assessed ink deposition accuracy.

In situations where the metamaterial structure is printed with a satisfactory ink deposition accuracy, the complementarity of the conductive and insulating elements is expected to be correspondingly satisfactory, with the conductive elements covering an half of a total area of the metamaterial structure and the insulating elements covering another half of the total area of the metamaterial structure. In such situations, it was found that Babinet's principle dictates that the spectral response is non-resonant, i.e., that the transmission (or reflection) of the incident terahertz radiation beam is 50% at least over the terahertz resonance frequency, with as much power being reflected and/or absorbed by the conductive elements than power being transmitted through the insulating elements. In contrast, in situations where the ink deposition accuracy is deficient, the complementarity of the conductive and insulating elements may not be correspondingly deficient, with the conductive elements covering more (or less) of the half of the total area of the metamaterial structure and the insulating elements covering less (or more) of the total area of the metamaterial structure. In such situations, it was found that Babinet's principle dictates that the spectral response is resonant, i.e., that the transmission (or reflection) of the incident terahertz radiation beam can vary over the terahertz resonance frequency. Two types of resonant responses can be measured: an inductive response and a capacitive response. As the inductive response indicates that too much conductive ink was used in the printing, the capacitive response indicates that not enough conductive ink was used in the printing.

Measuring first and second polarization components of the spectral response of the outgoing terahertz radiation beam is also envisaged. In these embodiments, the ink deposition accuracy can be assessed along either one or both axes of the metamaterial structure based on the first and second polarization components of the spectral response.

In accordance with a second aspect of the present disclosure, there is provided a method of assessing an ink deposition accuracy in an electronic device printing process, the method comprising: printing a metamaterial structure on a substrate using conductive ink, the metamaterial structure having a pattern of conductive elements interspersed with complementary insulating elements, the metamaterial structure having at least a terahertz resonance frequency; emitting a terahertz radiation beam incident on the metamaterial structure of the substrate, the incident terahertz radiation beam having power at least at the terahertz resonance frequency of the metamaterial structure; the metamaterial structure interacting with said incident terahertz radiation beam resulting in an outgoing terahertz radiation beam having a spectral response at least at the terahertz resonance frequency; measuring said spectral response of said outgoing terahertz radiation beam; assessing an ink deposition accuracy of said printing based on said measured spectral response; and generating a signal based on said assessed ink deposition accuracy.

Further in accordance with the second aspect of the present disclosure, said ink deposition accuracy can for example be assessed to be unsatisfactory upon determining that said spectral response is resonant.

Still further in accordance with the second aspect of the present disclosure, said ink deposition accuracy can for example indicate that too much conductive ink was used in said printing upon determining that said spectral response is inductive.

Still further in accordance with the second aspect of the present disclosure, said ink deposition accuracy can for example indicate that not enough conductive ink was used in said printing upon determining that said spectral response is capacitive.

Still further in accordance with the second aspect of the present disclosure, said ink deposition accuracy can for example be assessed to be satisfactory upon determining that said spectral response is non-resonant.

Still further in accordance with the second aspect of the present disclosure, said metamaterial structure can for example have a coordinate system comprising first and second axes being orthogonal to one another and coplanar with said substrate, said measuring can for example comprise measuring first and second polarization components of said spectral response of said outgoing terahertz radiation beam, said first and second polarization components being polarized along a respective one of said first and second axes of said coordinate system.

Still further in accordance with the second aspect of the present disclosure, said assessed ink deposition accuracy can for example have a first ink deposition accuracy associated to said printing along said first axis and a second ink deposition accuracy associated to said printing along said second axis.

Still further in accordance with the second aspect of the present disclosure, said ink deposition accuracy can for example be assessed to be unsatisfactory upon finding a non-null spectral shift between said first and second polarization components.

Still further in accordance with the second aspect of the present disclosure, said conductive elements and said insulating elements can collectively form for example a checkerboard-like pattern on said substrate.

Still further in accordance with the second aspect of the present disclosure, said conductive elements can for example cover an area which corresponds to an area covered by said insulating elements.

Still further in accordance with the second aspect of the present disclosure, said assessing can for example comprise comparing said measured spectral response to a reference spectral response, the reference spectral response being indicative of an interaction between a reference terahertz radiation beam and a reference metamaterial structure being satisfactorily printed using on a substrate.

Still further in accordance with the second aspect of the present disclosure, said printing can for example be performed according to a printing parameter, the method can for example further comprise modifying said printing parameter upon assessing that the ink deposition accuracy is unsatisfactory.

Still further in accordance with the second aspect of the present disclosure, said printing the metamaterial structure can for example be performed according to a printing parameter, the substrate having an electronic circuit printed on a given area of the substrate according to the printing parameter, the method further comprising associating said assessed ink deposition accuracy to said printed electronic circuit.

Still further in accordance with the second aspect of the present disclosure, the method can for example further comprise, upon determining that the assessed ink deposition accuracy of the electronic device is unsatisfactory, generating a signal indicative of an action to be performed.

Still further in accordance with the second aspect of the present disclosure, said action can for example include generating a file indicating that the printing of the electronic device is unsatisfactory.

Still further in accordance with the second aspect of the present disclosure, the method can for example further comprise, upon determining that the assessed ink deposition accuracy is unsatisfactory, updating at least a current printing parameter to an updated printing parameter based the assessed ink deposition accuracy.

Still further in accordance with the second aspect of the present disclosure, the method can for example further comprise reprinting the electronic circuit on the given area of the substrate based on said updated printing parameter.

In accordance with a third aspect of the present disclosure, there is provided an electronic device testing system for testing an electronic device having a substrate on which is printed a metamaterial structure using a conductive ink, the metamaterial structure having a pattern of conductive elements interspersed with complementary insulating elements, the metamaterial structure having at least a terahertz resonance frequency, the electronic device testing system comprising: a terahertz radiation emitter emitting a terahertz radiation beam incident on the metamaterial structure of the substrate, the incident terahertz radiation beam having power at least the terahertz resonance frequency of the metamaterial structure, the metamaterial structure interacting with said incident terahertz radiation beam resulting in an outgoing terahertz radiation beam having a spectral response at least at the terahertz resonance frequency; a terahertz radiation receiver receiving the outgoing terahertz radiation beam outgoing and measuring said spectral response at least at the terahertz resonance frequency; and a controller communicatively coupled to the terahertz radiation receiver, the controller having a processor and a memory having stored thereon instructions that when executed by the processor perform the step of: assessing an ink deposition accuracy of said printing based on said measured spectral response; and generating a signal based on said assessed ink deposition accuracy.

Further in accordance with the third aspect of the present disclosure, the terahertz radiation emitter can for example be a broadband terahertz radiation emitter, the terahertz radiation receiver measuring a spectral power distribution of at least a portion of the outgoing terahertz radiation beam, the system can for example further comprise broadband terahertz radiation reference receiver measuring a spectral power distribution of a portion of the incident terahertz radiation beam, the controller performing said assessing based the spectral power distributions of the incident terahertz radiation beam and of the outgoing terahertz radiation beam.

Still further in accordance with the third aspect of the present disclosure, the terahertz radiation emitter can for example be a broadband terahertz radiation emitter, the terahertz radiation receiver measuring a spectral power distribution of the outgoing terahertz radiation beam, the controller performing said assessing based on a first spectral region of said spectral response and on a second spectral region of said spectral response, the first and second spectral regions being spectrally different from one another.

Still further in accordance with the third aspect of the present disclosure, the terahertz radiation emitter and the terahertz radiation receiver can for example be complementary metal-oxide-semiconductor devices, the electronic device testing system being for example portable.

In accordance with a fourth aspect of the present disclosure, there is provided an electronic device production system comprising: an electronic device printing system receiving a substrate, printing an electronic circuit on a given area of the substrate using a conductive ink and printing a metamaterial structure on a remaining area of the substrate using the conductive ink, the metamaterial structure having a pattern of conductive elements interspersed with complementary insulating elements, the metamaterial structure having at least a terahertz resonance frequency; and an electronic device testing system receiving the previously printed substrate, the electronic device testing system comprising a terahertz radiation emitter emitting a terahertz radiation beam incident on the metamaterial structure of the substrate, the incident terahertz radiation beam having power at least at the terahertz resonance frequency of the metamaterial structure, the metamaterial structure interacting with said incident terahertz radiation beam resulting in an outgoing terahertz radiation beam having a spectral response at least at the terahertz resonance frequency; a terahertz radiation receiver receiving the outgoing terahertz radiation beam and measuring said spectral response; and a controller communicatively coupled to the terahertz radiation receiver, the controller having a processor and a memory having stored thereon instructions that when executed by the processor perform the step of: assessing an ink deposition accuracy of said printing based on said measured spectral response; performing an action upon determining that said assessed ink deposition accuracy is unsatisfactory.

Further in accordance with the fourth aspect of the present disclosure, said action can for example include generating a file indicating that the electronic device has been printed with an unsatisfactory ink deposition accuracy.

Still further in accordance with the fourth aspect of the present disclosure, said action can for example include modifying at least a printing parameter of said electronic device printing system.

Still further in accordance with the fourth aspect of the present disclosure, said action can for example include one of partially and wholly reprinting the electronic circuit of the electronic device after said modifying.

Many further features and combinations thereof concerning the present improvements will appear to those skilled in the art following a reading of the instant disclosure.

DESCRIPTION OF THE FIGURES

In the figures,

FIG. 15A is a schematic view of electromagnetic field interactions occurring along the X- and Y-directions for i-MCB and c-MCB patterns, in accordance with one or more embodiments;

FIG. 15B are graphs showing normalized transmission as a function of frequency for i-MCB, MCB and c-MCB patterns printed at a linear speed of 30 m/min, in accordance with one or more embodiments;

FIG. 15C are graphs showing normalized transmission as a function of frequency for i-MCB, MCB and c-MCB patterns printed at a linear speed of 50 m/min, in accordance with one or more embodiments;

DETAILED DESCRIPTION

Figure 1:
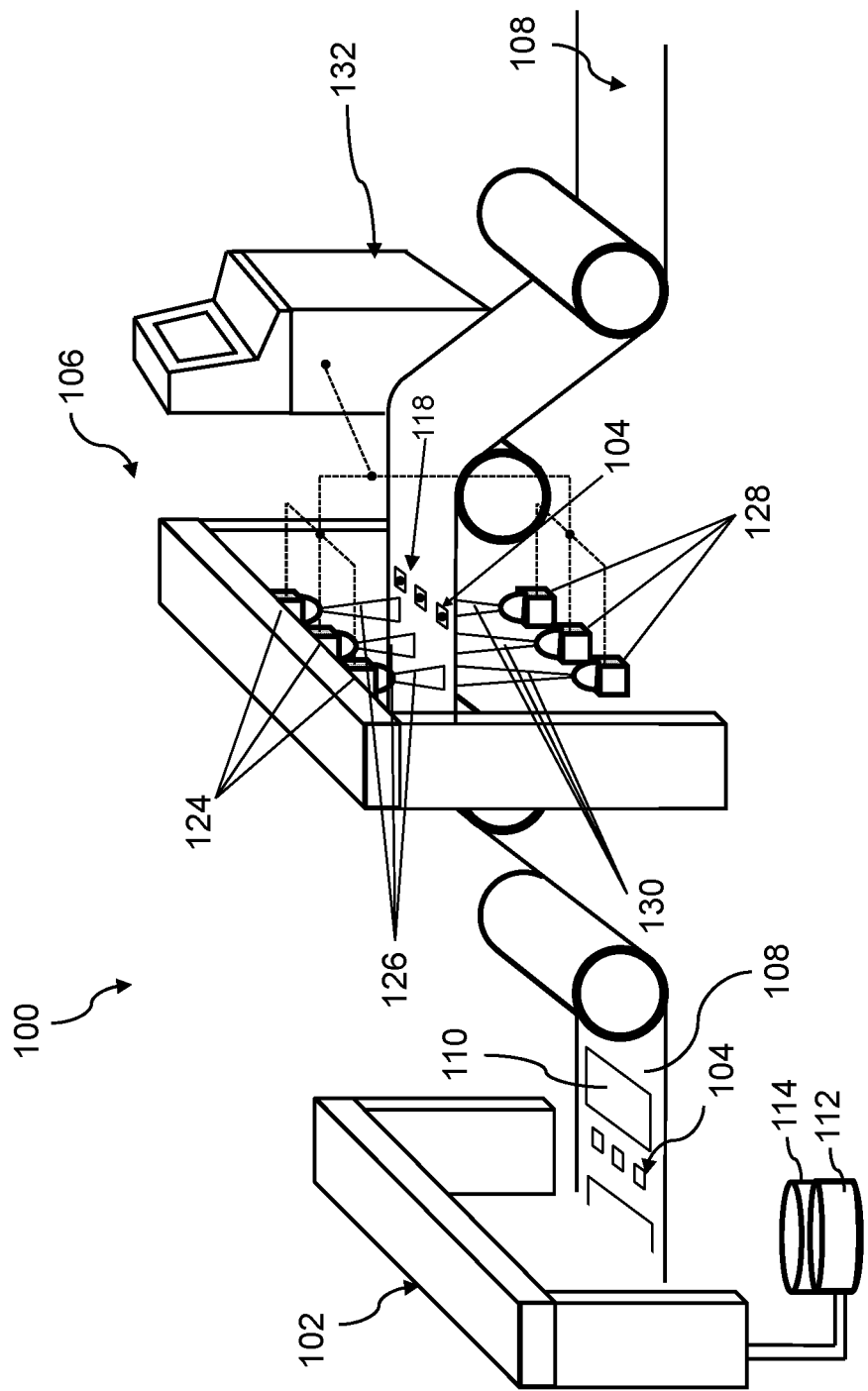
FIG. 1 is a schematic view of an example of an electronic device production system including an electronic device printing system, an electronic device testing system and a controller, in accordance with one or more embodiments.

FIG. 1 shows an example of an electronic device production system 100, in accordance with one or more embodiments. As depicted in this specific example, the electronic device production system 100 has an electronic device printing system 102 for printing electronic devices 104. An electronic device testing system 106 is also provided for testing the previously printed electronic devices 104.

In this example, the electronic device printing system 102 is configured to receive a substrate 108 and to print an electronic circuit 110 thereon using conductive ink according to conventional printing techniques. For instance, in this specific embodiment, the electronic device printing system 102 is configured to draw conductive ink 112 from an ink reservoir 114 and to deposit the conductive ink 112 in predetermined patterns on the substrate 108 to form the electronic circuit 110. The deposition of the conductive ink 112 can be performed according to one or more printing parameters which may be modified on the go, or drift over time.

In this specific embodiment, the conductive ink 112 includes silver nanoparticles which can be sintered to one another to form the electronic circuit 110. However, in some other examples, the conductive ink 112 can include gold nanoparticles, copper nanoparticles, and the like. Any type of commercially available or otherwise conventional conductive ink can be used.

Figure 2:
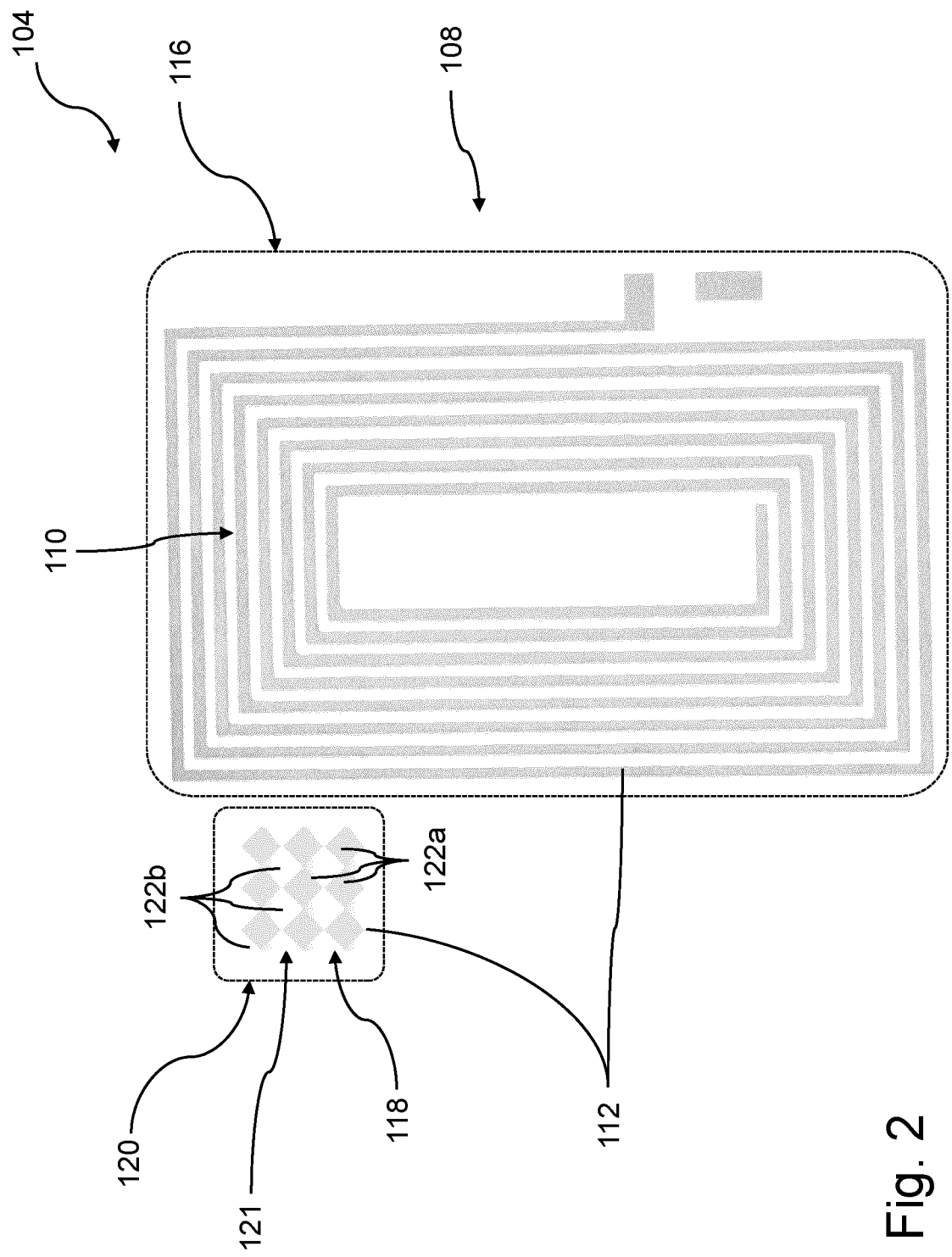
FIG. 2 is a top view of an example of an electronic device including a substrate on which an electronic circuit is printed and a metamaterial structure using the electronic device printing system of FIG. 1, in accordance with one or more embodiments.

Referring now to FIG. 2, the electronic device printing system 102 is configured to print the electronic circuit 110 on a given area 116 of the substrate 108 using the conductive ink 112 and to also print a metamaterial structure 118 on a remaining area 120 of the substrate 108 using the same ink 112.

The metamaterial structure 118 is configured to interact at terahertz frequencies, usually defined as 0.1 to 10 THz, preferably between 100 GHz and 1 THz, and most preferably of about 230 GHz. Indeed, terahertz radiation lies at the far end of the infrared band, just after the end of the microwave band, and corresponds to millimetre and sub-millimetre wavelengths between 3 mm and 0.03 mm. The term "terahertz" is meant to be interpreted broadly so as to encompass frequencies lying near the commonly accepted boundaries of the terahertz region of the electromagnetic spectrum.

Figure 3B:
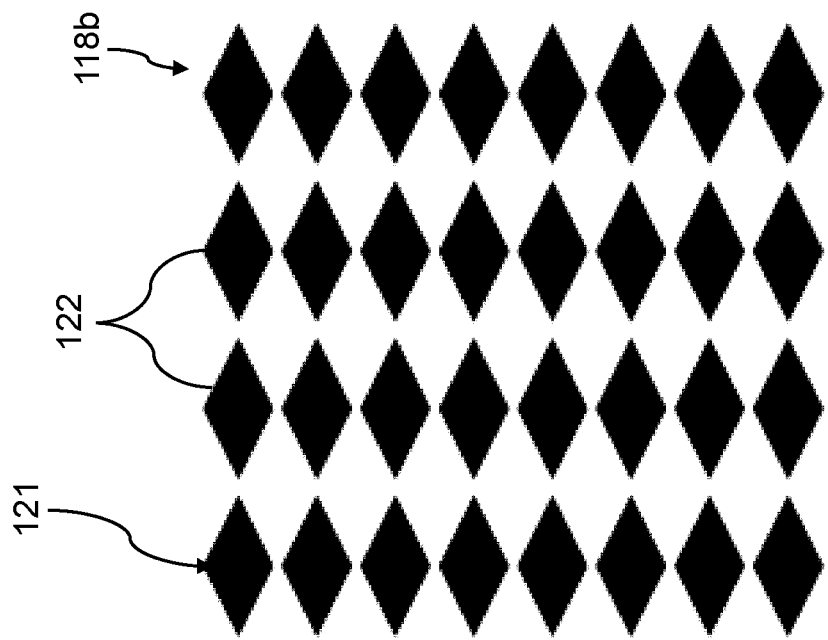
FIGS. 3A and 3B are top views of examples of metamaterial structures of the electronic device of FIG. 2, in accordance with some embodiments.
Figure 3A:
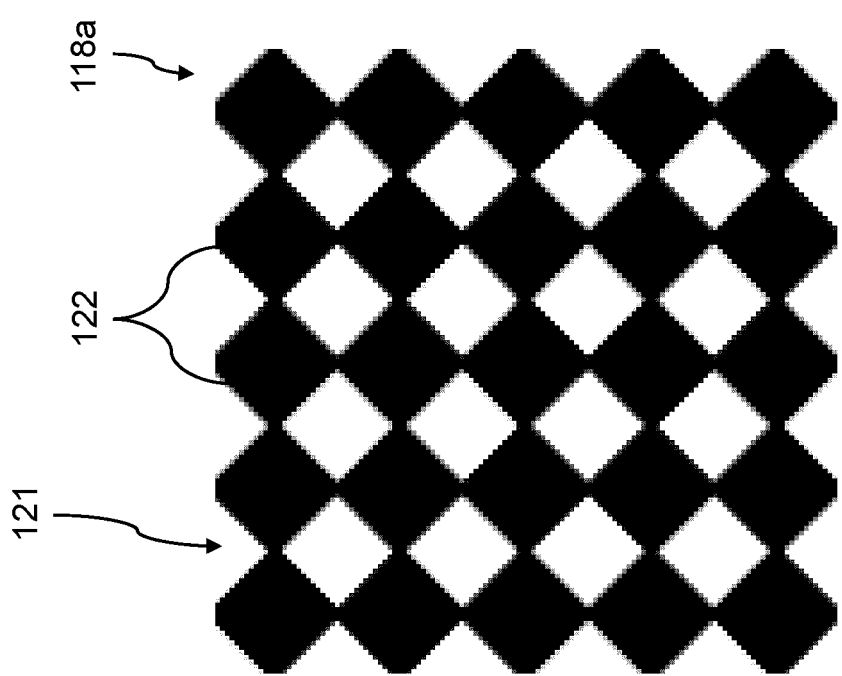

More specifically, the metamaterial structure 118 shown in this example has a pattern 121 of conductive elements 122a interspersed with complementary insulating elements 122b, which collectively provide a terahertz resonance frequency to the metamaterial structure 118. The conductive elements 122a are defined by regions having the conductive ink 112 deposited thereon. The insulating elements 122b are defined by regions lacking the conductive ink 112. It is encompassed that when the metamaterial structure 118 is printed with satisfactory ink deposition accuracy, the conductive elements 122a have an area Ac which can substantially correspond to an area Ai of the insulating elements 122b (Ac/Ai≈1). In other words, there is as much area covered by conductive elements 122*a* than area covered by the insulating elements 122*b*, and will thereby lead to a non-resonant response according to Babinet's principle. However, if the ink deposition accuracy is unsatisfactory, the percentage of area covered by the conductive and insulating elements 122*a* and 122*b* can be above or below the nominal half (Ac/Ai> or <1) thereby leading to resonant responses according to Babinet's principle. FIGS. 3A and 3B show other examples of metamaterial structures 118*a* and 118*b* in greater detail. In these embodiments, checkerboard-like patterns such as inverted checkerboard patterns were preferred. As shown, the inverted checkerboard patterns are conventional checkerboard patterns where each of the tiles is rotated by 90 degrees about its centre. Such patterns can be preferred as connections between vertices of the rhombuses are substantially tiny, thereby enhancing any potential ink deposition accuracy deficiencies, at least in some embodiments. As can be understood, any suitable metamaterial structure providing a terahertz resonance frequency can be used.

In these examples, the metamaterial structures 118*a* and 118*b* can have dimensions ranging between 1 mm and 50 mm, preferably between 5 mm and 30 mm, and most preferably between 10 mm and 25 mm. The conductive and insulating elements 122*a* and 122*b* can have dimensions ranging between 0.5 mm and 2 mm, preferably between 0.8 and 1.5 mm, and most preferably between 0.9 and 1.2 mm.

Referring back to FIG. 1, the electronic device testing system 106 has one or more terahertz radiation emitters (hereinafter "the terahertz radiation emitters 124") which are each configured to emit an incident terahertz radiation beam 126 to be incident on the metamaterial structure 118 of the substrate 108 of the electronic device 104.

It is intended that the incident terahertz radiation beam 126 has power at least the terahertz resonance frequency of the metamaterial structure 118 so that a spectral power distribution of the incident terahertz radiation beam 126 can be modified depending on an actual ink deposition accuracy of the conductive ink 112 used to print the metamaterial structure 118.

Generally, the greater the ink deposition accuracy of the conductive ink 112 is, the lesser resonant the response of the metamaterial structure 118 to an incident terahertz radiation beam is. Conversely, the lower the ink deposition accuracy of the conductive ink 112 is, the more resonant the response of the metamaterial structure 118 to an incident terahertz radiation beam is.

The electronic device testing system 106 has one or more terahertz radiation receivers (hereinafter "the terahertz radiation receivers 128") which are each configured to receive an outgoing terahertz radiation beam 130 outgoing from the metamaterial structure 118 and to measure an amplitude of an electric field (sometimes referred to simply as "electric field amplitude") of the outgoing terahertz radiation beam 130 at least at the terahertz resonance frequency.

In some embodiments, the terahertz radiation receiver 128 is a terahertz time domain spectroscopy (THz-TSD) receiver which measures an amplitude of the electric field of the outgoing terahertz radiation beam 130 as function of time, and which is configured for performing a Fourier transform of that signal to provide amplitude as a function of frequency. However, the terahertz radiation receiver 128 can be any type of suitable terahertz radiation receiver such as a terahertz spectrometer or imager, for instance.

As illustrated, the substrate 108 in this example is disposed between the terahertz radiation emitters 124 and the terahertz radiation receivers 128. As such, the outgoing terahertz radiation beam 130 results from the propagation of the incident terahertz radiation beam 126 through the substrate 108 and is thus collinear with the incident terahertz radiation beam 126 in this example.

However, in some other embodiments, the terahertz radiation emitters 124 and the terahertz radiation receivers 128 can be disposed on a same side relative to the substrate 108, in which case the outgoing terahertz radiation beam 130 can result from reflection, scattering and/or diffraction of the incident terahertz radiation beam 130 on the substrate 108. In other words, in some embodiments, the outgoing terahertz radiation beam 130 can include the remaining part of the incident terahertz radiation beam that is not absorbed by the metamaterial structure 118. In some embodiments, the terahertz radiation beam can include terahertz radiation of the incident terahertz radiation beam that is scattered and/or otherwise diffracted by the metamaterial structure 118.

As depicted in this example, the electronic device testing system 106 has a controller 132 which is communicatively coupled to the electronic device printing system 102, to the terahertz radiation emitters 124 and to the terahertz radiation receivers 128.

The controller 132 is configured to assess an ink deposition accuracy being indicative of how satisfactory the ink deposition in the printing process was. The ink deposition accuracy can be qualitatively expressed in a binary fashion, e.g., satisfactory or unsatisfactory, be expressed as a degree of accuracy on a scale of 0 to 10, or be expressed quantitatively in terms of a maximal resolution achievable by the printing process, depending on the embodiment.

In this example, the controller 132 is configured to generate a signal indicative of an action to be performed when the assessed ink deposition accuracy of the conductive ink 112 is unsatisfactory, or when it is below a given accuracy threshold.

For instance, in some embodiments, the controller 132 is configured to generate an electronic file or alert indicating that one or more of the electronic devices 104 have been printed with unsatisfactory ink deposition accuracy. Accordingly, the electronic devices logged in this file or alert can be later removed from the production line as they are most likely to be unsatisfactory.

In some other embodiments, the controller 132 is configured to modify at least one printing parameter of the electronic device printing system 102. For instance, the printing parameter can include, but is not limited to, a flow rate indicative at which flow rate the conductive ink 112 is deposited on the substrate 108, a linear speed of the moving substrate 108, a resolution at which the conductive traces are printed, a composition of the conductive ink 112, a viscosity of the conductive ink 112, a temperature of the sintering system, and other suitable printing parameters which can lead to increasing the ink deposition accuracy with which the conductive ink 112 drawn from the ink reservoir 114 is deposited on the substrate 108.

In these embodiments, once one or more printing parameters have been modified, for electronic devices having been identified as unsatisfactory, the controller 132 can instruct the electronic device printing system 102 to reprint, wholly or partially, the electronic circuit of these electronic circuits so as to render them satisfactory. As can be understood, proceeding accordingly can reduce losses, and thus increase efficiency of the production line.

As can be understood, the electronic device testing system 106 can allow the quality of the printed electronic devices 104 to be controlled and optimized in real time or quasi-real time based on the assessed ink deposition accuracy during production of the electronic devices.

Figure 4:
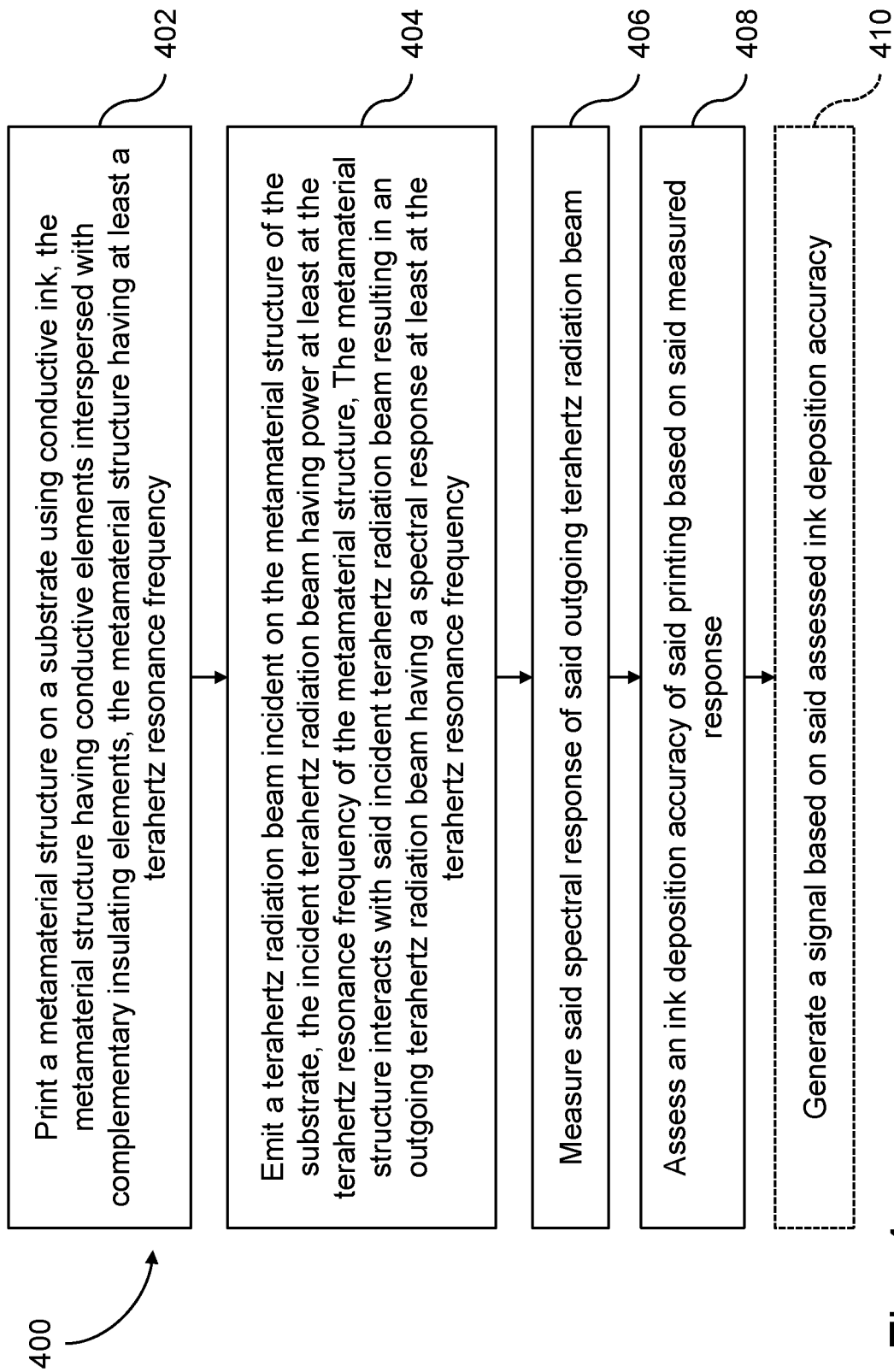
FIG. 4 is a flowchart of a method of assessing an ink deposition accuracy of a printing process, in accordance with one or more embodiments.

FIG. 4 shows a flowchart of an example of a method 400 for assessing an ink deposition accuracy at which an electronic device 104 having the electronic circuit 110 being printed on the given area 116 of the substrate 108 using the conductive ink 112. The method 400 will be described with reference to the electronic device production system 100 of FIG. 1 for ease of reading.

At step 402, the electronic device printing system 102 prints a metamaterial structure 118 on a remaining area 120 of the substrate 108 using the conductive ink 112. As mentioned above, the metamaterial structure 118 has a pattern 121 of conductive elements 122a interspersed with complementary insulating elements 122b, providing a terahertz resonance frequency to the metamaterial structure 118. Accordingly, should the conductive ink 112 be applied with a satisfactory ink deposition accuracy, the metamaterial structure 118 would interact with an incident terahertz radiation beam in a non-resonant manner.

At step 404, each terahertz radiation emitter 124 emits a terahertz radiation beam 126 so as to be incident on the metamaterial structure 118 printed on the substrate 108. As discussed, the incident terahertz radiation beam 126 has power at least at the terahertz resonance frequency of the metamaterial structure 118, leaving an outgoing terahertz radiation beam 130 to be outgoing (e.g., transmitted, reflected) from the metamaterial structure 118.

At this stage of the method, the metamaterial structure 118 modifies a first spectral power distribution of the incident terahertz beam 126 which thereby causes the outgoing terahertz radiation beam 130 to have a second spectral power distribution being different from the first spectral power distribution. The difference between the first and second spectral power distribution is simply referred to as a spectral response herein.

At step 406, each terahertz radiation receiver 128 measures the spectral response of the outgoing terahertz radiation beam 130 at least at the terahertz resonance frequency.

At step 408, the controller 132 assesses an ink deposition accuracy based on the measured spectral response.

At step 410, the controller 132 generates one or more signals indicative of one or more actions to be performed when the assessed ink deposition accuracy of the metamaterial structure 118 is determined to be unsatisfactory, or below a given ink deposition accuracy threshold. Step 410 may be omitted in some embodiments.

The controller 132 can be provided as a combination of hardware and software components. The hardware components can be implemented in the form of a computing device 500, an example of which is described with reference to FIG. 5. Moreover, the software components of the controller 132 can be implemented in the form of a software application 600, an example of which is described with reference to FIG. 6.

Figure 5:
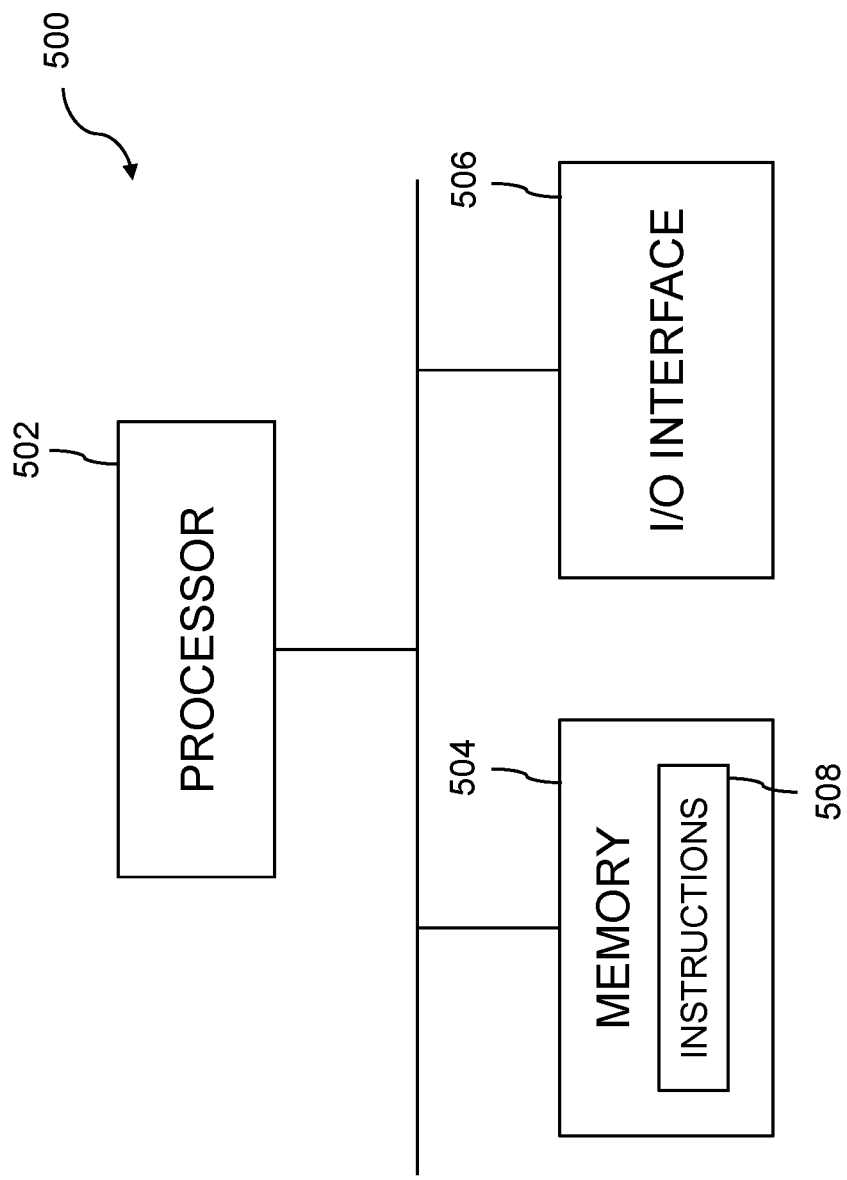
FIG. 5 is a schematic view of an exemplary computing device of the controller of FIG. 1, in accordance with one or more embodiments.

Referring to FIG. 5, the computing device 500 can have a processor 502, a memory 504, and I/O interface 506. Instructions 508 for performing the method 400, and/or any other related steps described herein, can be stored on the memory 504 and are accessible by the processor 502.

The processor 502 can be, for example, a general-purpose microprocessor or microcontroller, a digital signal processing (DSP) processor, an integrated circuit, a field-programmable gate array (FPGA), a reconfigurable processor, a programmable read-only memory (PROM), or any combination thereof.

The memory 504 can include a suitable combination of any type of computer-readable memory that is located either internally or externally such as, for example, random-access memory (RAM), read-only memory (ROM), compact disc read-only memory (CDROM), electro-optical memory, magneto-optical memory, erasable programmable read-only memory (EPROM), and electrically erasable programmable read-only memory (EEPROM), Ferroelectric RAM (FRAM) or the like.

Each I/O interface 506 enables the computing device 500 to interconnect with one or more input devices, such as the terahertz radiation receivers 128, or with one or more output devices such as the electronic device printing system 102, the terahertz radiation emitters 124, the sintering system and any other component of the production line if need be.

Each I/O interface 506 enables the controller 132 to communicate with other components, to exchange data with other components, to access and connect to network resources, to serve applications, and perform other computing applications by connecting to a network (or multiple networks) capable of carrying data including the Internet, Ethernet, plain old telephone service (POTS) line, public switch telephone network (PSTN), integrated services digital network (ISDN), digital subscriber line (DSL), coaxial cable, fiber optics, satellite, mobile, wireless (e.g. Wi-Fi, WiMAX), SS7 signaling network, fixed line, local area network, wide area network, and others, including any combination of these.

Figure 6:
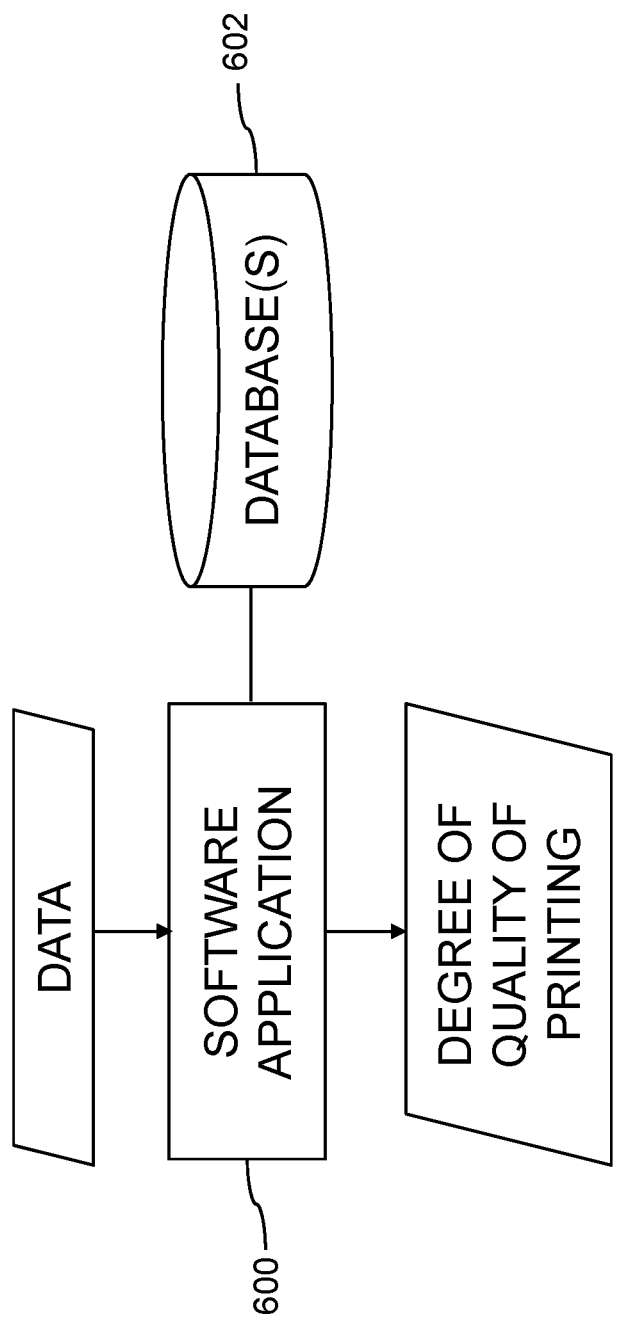
FIG. 6 is a schematic view of an example of a software application of the controller of FIG. 1 being configured to perform at least some steps of the method of FIG. 4, in accordance with one or more embodiments.

Referring now to FIG. 6, the software application 600 is configured to receive one or more amplitude signals, values and/or data and to assess an ink deposition accuracy upon processing the amplitude signals, value and/or data. In some embodiments, the software application 600 is stored on the memory 504 and accessible by the processor 502 of the computing device 500.

In some embodiments, one or more accuracy thresholds Ath can be stored in one or more databases 602 which are accessible by the software application 600. In some other embodiments, the action(s) and/or instruction(s) to be performed when the assessed ink deposition accuracy is unsatisfactory or below any one of the accuracy thresholds Ath can also be stored on the databases 602.

The computing device 500 and the software application 600 described above are meant to be examples only. Other suitable embodiments of the controller 132 can also be provided, as it will be apparent to the skilled reader.

Figure 7:
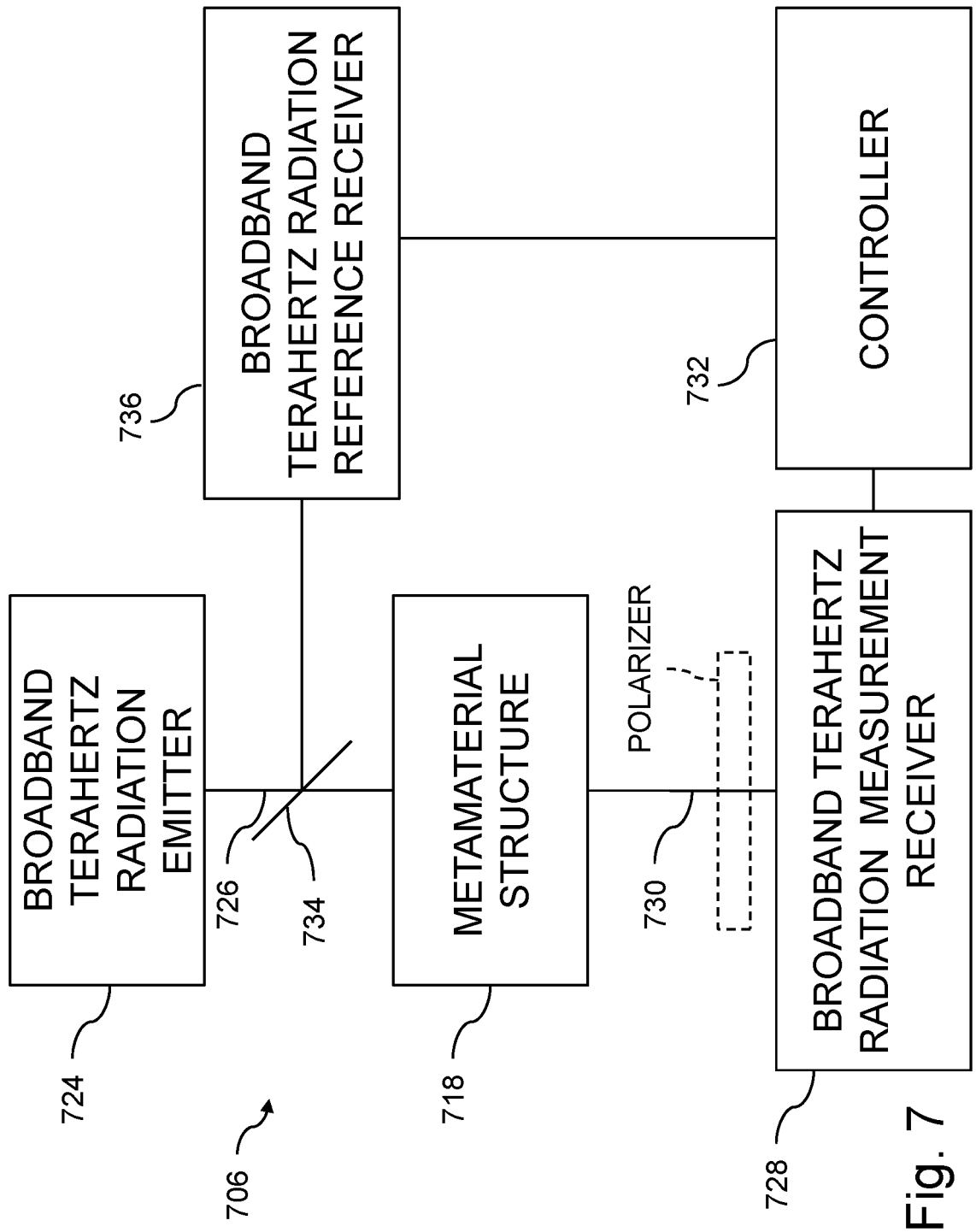
FIG. 7 is a schematic view of an example of an electronic device testing system, with broadband terahertz radiation reference and measurement receivers, for measuring a spectral response of a terahertz radiation beam outgoing from a metamaterial structure, in accordance with one or more embodiments.

FIG. 7 shows another example of an electronic device testing system 706, in accordance with another embodiment. As depicted, the electronic device testing system 706 has a broadband terahertz radiation emitter 724 which is configured to emit a broadband terahertz radiation beam 726 towards the metamaterial structure 718.

As can be understood, the terahertz radiation beam 726 is broadband as it has power at the terahertz resonance frequency of the metamaterial structure but also at other surrounding frequencies, spectrally spaced from the terahertz resonance frequency. In other words, the broadband terahertz radiation beam 726 has power within a given range of frequencies including the terahertz resonance frequency among other frequencies.

The electronic device testing system 706 has a terahertz radiation beam splitter 734 which is configured to redirect a portion of the incident terahertz radiation beam 726 towards a broadband terahertz radiation reference receiver 736 where reference values can be measured.

The electronic device testing system 706 also has a broadband terahertz radiation measurement receiver 728 which is configured to receive a terahertz radiation beam 730 outgoing from the metamaterial structure 718.

Figure 8A:
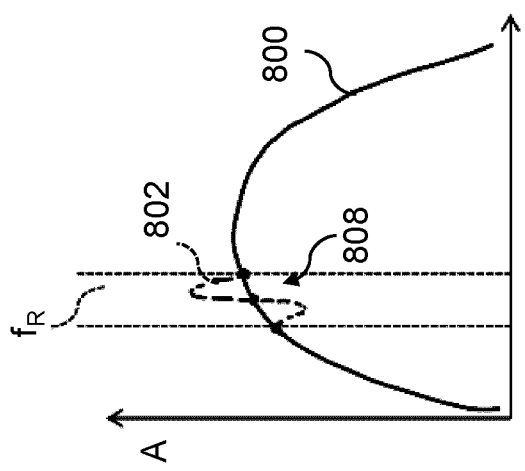
FIG. 8A is a graph showing reference and measurement electric field amplitudes as measured using the broadband terahertz radiation reference and measurement receivers of FIG. 7, respectively, when the measured response is non-resonant, in accordance with one or more embodiments.
Figure 8B:
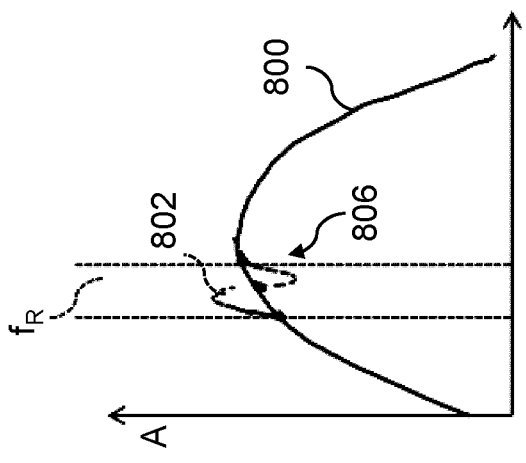
FIG. 8B is a graph showing reference and measurement electric field amplitudes as measured using the broadband terahertz radiation reference and measurement receivers of FIG. 7, respectively, when the measured response is inductive, in accordance with one or more embodiments.
Figure 8C:
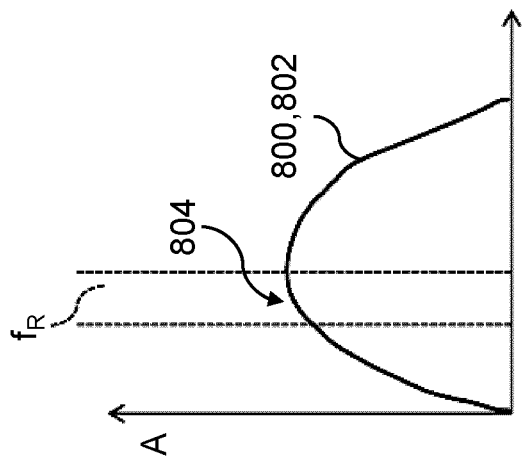
FIG. 8C is a graph showing reference and measurement electric field amplitudes as measured using the broadband terahertz radiation reference and measurement receivers of FIG. 7, respectively, when the measured response is capacitive, in accordance with one or more embodiments.

In this example, the controller 732 receives data indicative of a first spectral power distribution of the incident terahertz radiation beam 726 measured by the broadband terahertz radiation reference receiver 736 and a second spectral power distribution of the outgoing terahertz radiation beam 730 as measured by the broadband terahertz radiation measurement receiver 728. Examples of such spectral power distributions are shown in FIGS. 8A, 8B and 8C which show first and second spectral power distributions 800 and 802 for situations where the response is non-resonant, inductive and capacitive, respectively. FIGS. 8A, 8B and 8C show spectral transmission (or equivalently the normalized spectral power distribution) based on a ratio of the second spectral power distribution 802 over the first spectral power distribution 800.

Figure 8D:
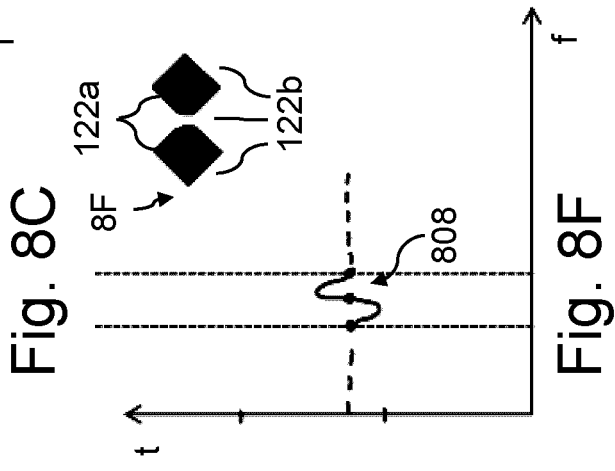
FIG. 8D is a graph showing a spectral transmission based on the reference and measurement electric field amplitudes of FIG. 8A, in accordance with one or more embodiments.
Figure 8E:
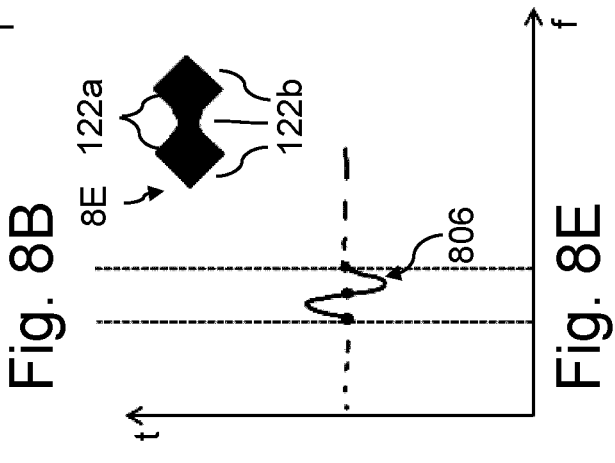
FIG. 8E is a graph showing a spectral transmission based on the reference and measurement electric field amplitudes of FIG. 8B, in accordance with one or more embodiments.
Figure 8F:
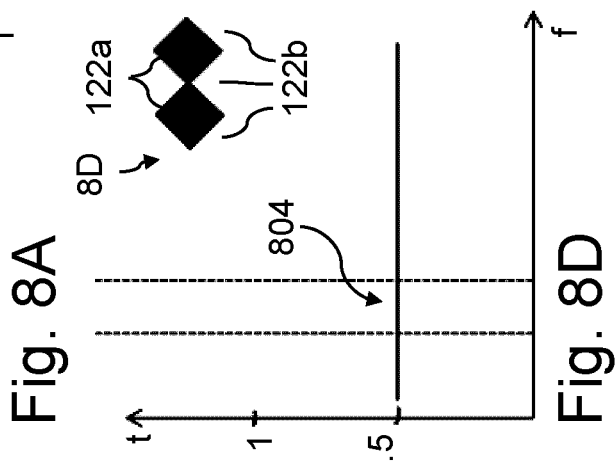
FIG. 8F is a graph showing a spectral transmission based on the reference and measurement electric field amplitudes of FIG. 8C, in accordance with one or more embodiments.

As can be appreciated, FIGS. 8A and 8D show non-resonant responses 804 in which case the ink deposition accuracy can be assessed to be satisfactory. For instance, as the ink deposition accuracy is satisfactory, the conducting and insulating elements 122a and 122b are complementary, such as shown at inset 8D, thereby providing a non-resonant response to an incident terahertz radiation beam. In contrast, FIGS. 8B and 8E show inductive resonant responses 806 in which case the ink deposition accuracy can be assessed to be unsatisfactory, as too much conductive ink was deposited in the printing of the metamaterial structure. Such a response can be observed when the conducting and insulating elements 122a and 122b are bounded by too much conductive ink, thereby destroying their complementarity, such as shown at inset 8E. In this case, the response to an incident terahertz radiation beam shows a resonance of the inductive type, as the conducting element 122a are more electrically connected to one another than they should be, which in turn allow them to act as inductive elements. Similarly, FIGS. 8C and 8F show capacitive resonant responses 808 in which case the ink deposition accuracy can be assessed to be unsatisfactory, as not enough conductive ink was deposited in the printing of the metamaterial structure. The capacitive resonant response can be observed when the conducting and insulating elements 122a and 122b are bounded by not enough conductive ink, thereby destroying, yet in another manner, their complementarity, such as shown at inset 8F. As can be expected, the response to an incident terahertz radiation beam shows a resonance response of the capacitive type, as the conductive elements 122a are not electrically connected to one another thereby allowing them to act as capacitive elements.

As discussed above, the type of response that is in fact measured can be determined in a number of ways. In some embodiments, the type of response can be determined using a response type recognition module operable by the controller 732. For instance, upon determining that the measured response has corresponding spectral power distributions 800 and 802, or equivalently a flat transmission, the measured response can be associated to a non-resonant response. Moreover, upon determining that the measured response within the terahertz resonance frequency is either sinusoidal or cosinusoidal, the measured response can be associated to an inductive response or a capacitive response. As can be appreciated, in the rather sinusoidal responses of FIGS. 8B and 8E, or in the cosinusoidal responses of FIGS. 8C and 8F, adiabatic frequencies can be identified within the terahertz resonance frequency. At these adiabatic frequencies, illustrated as black dots in FIGS. 8B, 8C, 8E and 8F, the first and second spectral distributions 800 and 802 intersect to one another. As these adiabatic frequencies should be similar for similar metamaterial structures when interrogated with similar incident terahertz radiation beams, one may identify the type of response by comparing measurements at only one chosen frequency as long as the chosen frequency is within the terahertz resonance frequency and spectrally spaced apart from any one of the adiabatic frequencies.

Figure 9:
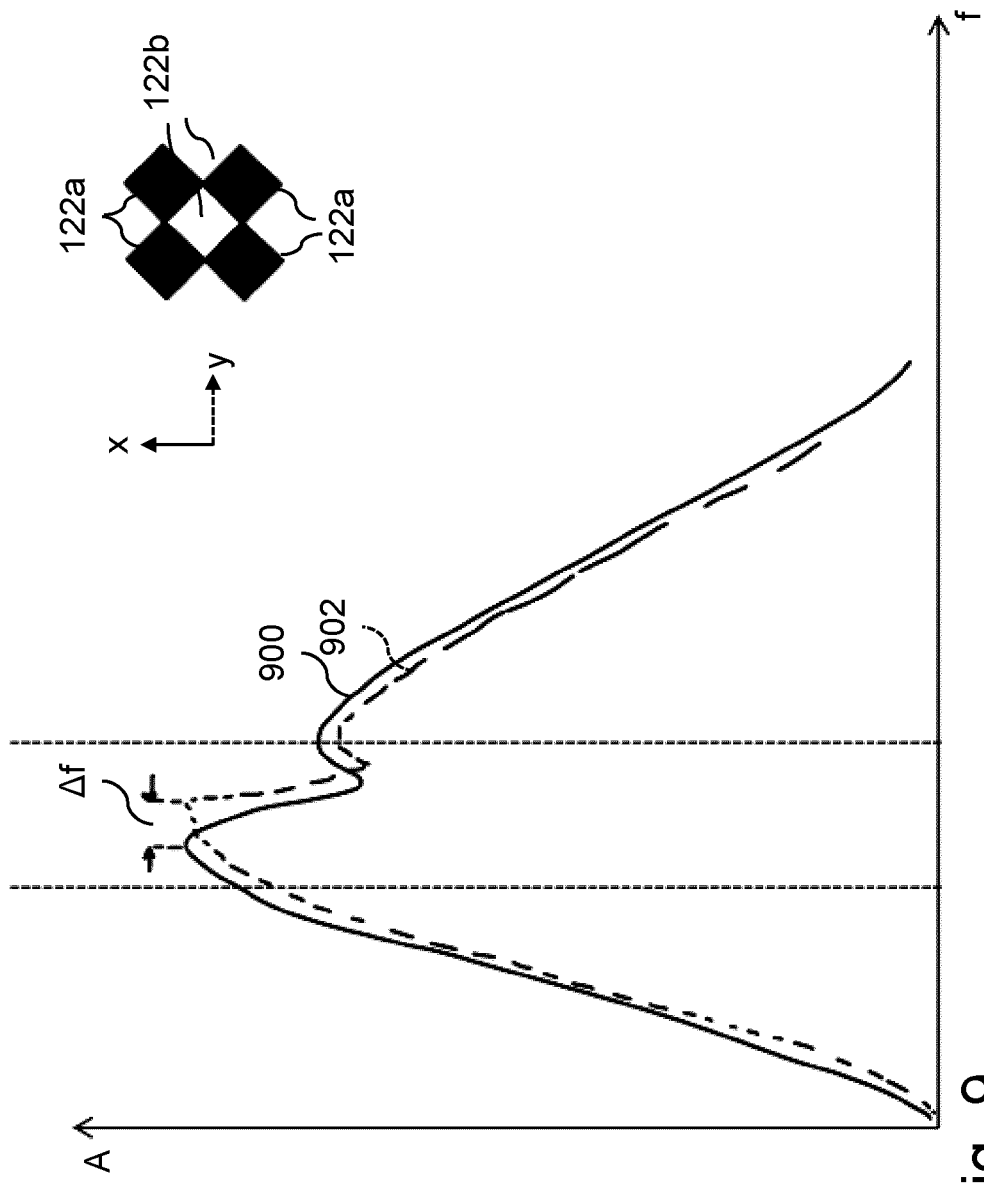
FIG. 9 is a graph showing polarization-dependent spectral transmissions as measured using the broadband terahertz radiation reference and measurement receivers of FIG. 7, respectively, in accordance with one or more embodiments.

FIG. 9 shows spectral transmissions 900 and 902 for first and second polarization components of the measured response. Such polarization components can be measured by providing one or more polarizers in the optical path of either one of the incident or outgoing terahertz radiation beam. As can be appreciated, when the first and second polarization components are polarized along a respective one of first and second axes x and y of the pattern of conductive elements 122a interspersed with complementary insulating elements 122b, the ink deposition accuracy assessment can be performed for printing along the x-axis and along the y-axis independently from one another.

For instance, in some embodiments, the controller 732 assesses a first ink deposition accuracy associated to the printing of the metamaterial structure along the x-axis and/or assesses a second ink deposition accuracy associated to the printing of the metamaterial structure along the y-axis. Additionally or alternately, the controller 732 can assess the ink deposition accuracy is assessed to be unsatisfactory upon finding a non-null spectral shift $\Delta f$ between the first and second polarization components 900 and 902.

Figure 10:
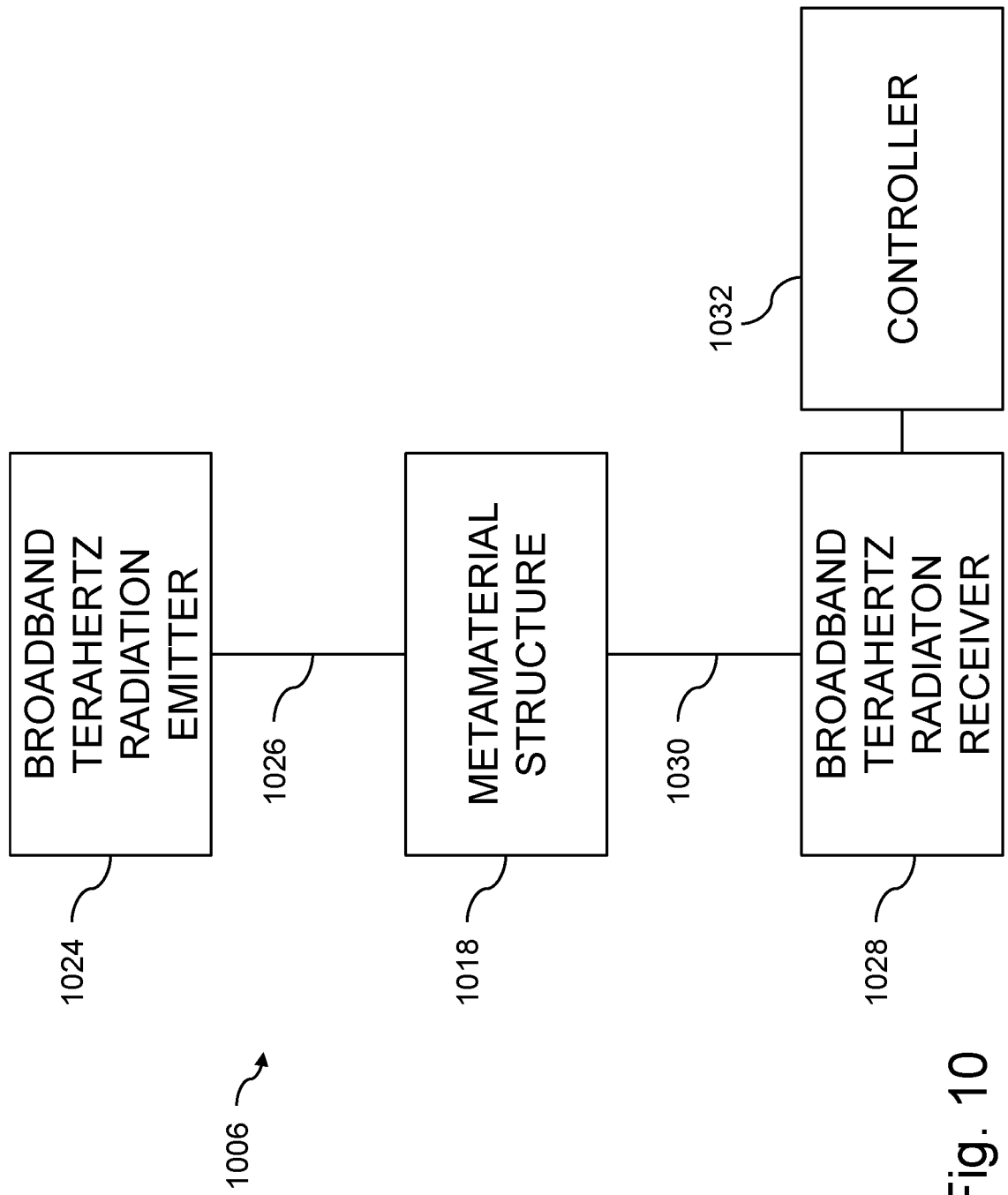
FIG. 10 is a schematic view of another example of an electronic device testing system, with a single broadband terahertz radiation receiver, in accordance with one or more embodiments.

FIG. 10 shows another example of an electronic device testing system 1006, in accordance with another embodiment. As depicted, the electronic device testing system 1006 has a single broadband terahertz radiation emitter 1024 which is configured to emit a broadband terahertz radiation beam 1026 towards the metamaterial structure 1018.

Similarly, the terahertz radiation beam 1026 is broadband as it has power at the terahertz resonance frequency of the metamaterial structure and also at other frequencies, spectrally spaced from the terahertz resonance frequency.

In this example, the electronic device testing system 1006 also has a single broadband terahertz radiation receiver 1028 which is configured to receive a terahertz radiation beam 1030 outgoing from the metamaterial structure 1018.

In this example, the controller 1032 receives data indicative of a spectral power distribution of the outgoing terahertz radiation beam 1030 as measured by the broadband terahertz radiation receiver 1028.

Figure 11A:
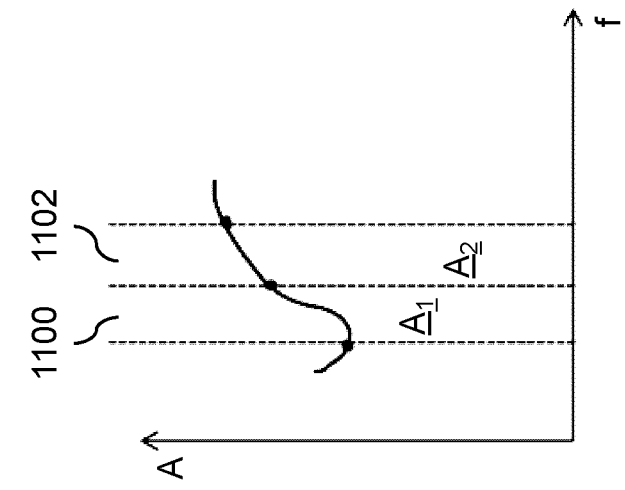
FIG. 11A is a graph showing a spectral transmission for a non-resonant response in an outgoing terahertz radiation beam, in accordance with one or more embodiments.
Figure 11B:
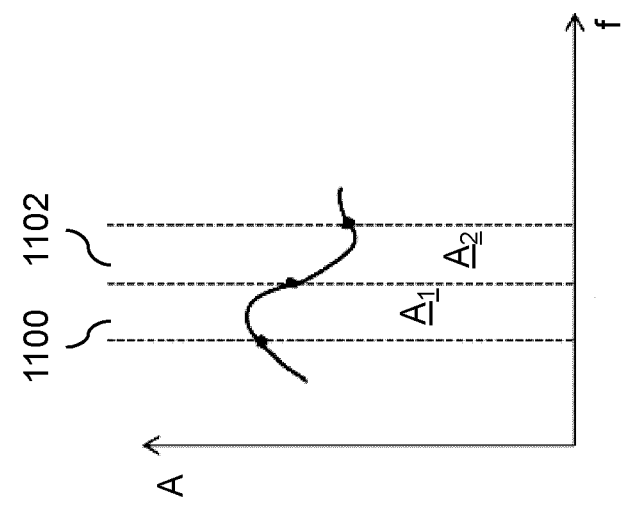
FIG. 11B is a graph showing a spectral transmission for an inductive response in an outgoing terahertz radiation beam, in accordance with one or more embodiments.
Figure 11C:
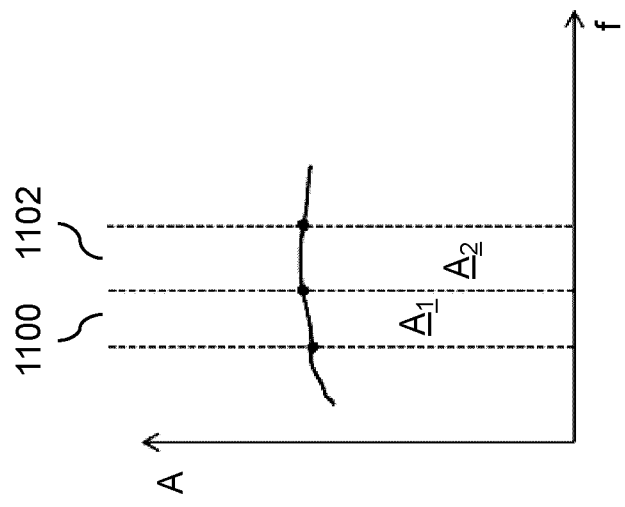
FIG. 11C is a graph showing a spectral transmission for a capacitive response in an outgoing terahertz radiation beam, in accordance with one or more embodiments.

Examples of such data are shown in FIGS. 11A-C. As can be seen, in this example, spectral responses within the terahertz resonance frequency are shown for non-resonant, inductive resonant and capacitive resonant responses respectively in FIGS. 11A, 11B and 11C. In this embodiment, the broadband terahertz radiation receiver 1028 integrates the amplitude of the measured response over a first region 1100 of the terahertz resonance frequency, to obtain integrated value A1, and integrates the amplitude of the measured response over a second region 1102 of the terahertz resonance frequency, to obtain integrated value A2. The boundaries of the first and second regions 1100 and 1102 can be dictated by the adiabatic frequencies discussed above (see black dots). By comparing the results of the above-mentioned integrated values A1 and A2, the controller 1032 can identify which type of response is measured and then assess the ink deposition accuracy. For instance, if the first integrated value A1 corresponds to the second integrated value A2, within a given tolerance, the ink deposition accuracy can be assessed to be satisfactory. However, if the first integrated value A1 differs from the second integrated value A2, by more than the given tolerance, the ink deposition accuracy can be assessed to be unsatisfactory. Moreover, the type of measured response can be determined by comparing the first and second integrated values A1 and A2 to one another. For instance, if a ratio of the first integrated value A1 over the second integrated value is above than 1, the response can be determined to be inductive resonant. In contrast, if a ratio of the first integrated value A1 over the second integrated value is below than 1, the response can be determined to be capacitive resonant. The numerical value of such ratio can even be used to quantitatively assess the ink deposition accuracy. In this embodiment, the controller 1032 can be configured to determine a ratio of the first integrated value A1 and the second integrated value A2, which can be mapped to ink deposition accuracies based on some calibration data. As can be appreciated, in this embodiment, reference measurements are omitted.

Figure 12:
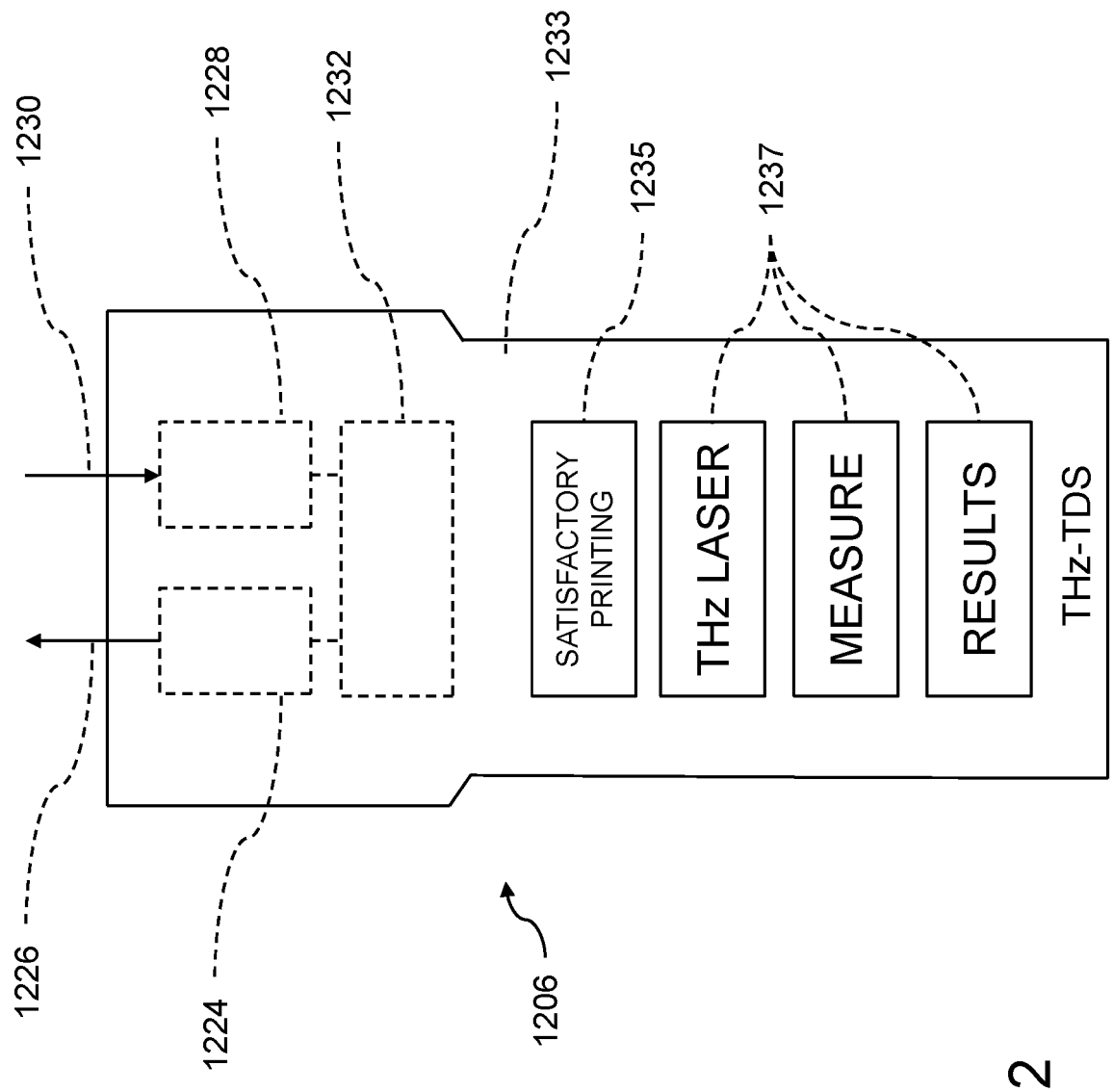
FIG. 12 is a schematic view of an example of the electronic device testing system of FIG. 11, shown in a portable format, in accordance with one or more embodiments.

As can be understood, any one of the above-mentioned electronic device testing systems can be enclosed within a portable frame 1233, such as the one shown in FIG. 12. Indeed, in this embodiment, the terahertz radiation emitter and image receiver 1124 and 1128 are provided in the form of complementary metal-oxide-semiconductor (CMOS) devices which can have a reduced footprint. The electronic device testing system 1106 also has a display 1135 which can display any ink deposition accuracy values by the controller 1132. Buttons 1137 can also be provided to initiate measurements and/or display measurement results on the display 1135. Example of such CMOS devices can be described in the following references: R. A. Hadi, et al., IEEE Journal of Solid-State Circuits 47, 2999 (2012); X. Wu et al., IEEE J. of Solid-State Circuits 51, 3049 (2016); M. M. Assefzadeh and A. Babakhani, IEEE J. Solid State Circuits 52, 2905 (2017); X. Wu and K. Sengupta, IEEE J. Solid State Circuits 52, 389 (2017); K. Sengupta and A. Hajimiri, IEEE J. Solid State Circuits 47, 3013 (2012); and J. Grzyb, B. Heinemann, and U. R. Pfeiffer, IEEE Trans. Microwave Theory Tech. 65, 4357 (2017).

Example 1—Printing Accuracy Tracking with 2D Optical Microscopy and Super-Resolution Metamaterial-Assisted 10 Terahertz Spectroscopy Printable electronics is a promising manufacturing technology for the potential production of low-cost flexible electronic devices, ranging from displays to active wear. It is known that rapid printing of conductive ink on a flexible substrate is vulnerable to several sources of variation during the manufacturing process. However, this process is still not being subjected to a quality control method that is both non-invasive and in situ. To address this issue, there is proposed to control the printing accuracy by monitoring the spatial distribution of the deposited ink using terahertz (THz) waves. The parameters studied are the printing speed of an industrial roll-to-roll press with flexography printing units and the pre-calibration compression, or expansion factor, for a pattern printed on a flexible plastic substrate. The pattern, which is carefully selected, has Babinet's electromagnetic transmission properties in the THz frequency range. To validate the suggested approach, the geometric variations of the printed pattern were quantified by visible microscopy and compared its accuracy using one-dimensional THz spectroscopy. This experimental example shows a remarkable agreement between visible microscopic observation of the printing performance and the signature of the THz transmission. Notably, under specific conditions, one-dimensional (10) THz information from a resonant pattern can be more accurate than two-dimensional (2D) microscopy information. This result paves the way for a simple strategy for non-invasive and contactless in situ monitoring of printable electronics production.

Printed electronics (PE) has become a promising technology for the production of a wide range of flexible electronic components, ranging from photovoltaic devices, displays, sensors and portable items to smart packaging. The resulting functionality of these printed devices is highly dependent on the quality of the deposited ink. Nowadays, ink quality is mainly controlled based on defects, including electrical properties, surface morphology, and ink distribution, which induces dimensional distortions, such as enlargement or shrinkage. To increase the electrical functionality of printed devices, it is critical to monitor the dimensional distortions, which have been tested extensively. Currently, enlargement or shrinkage is monitored with optical microscopy under specific conditions, such as an appropriate illumination or along a particular direction, which might be problematic in an industrial environment. Current approaches include defect detection realized by counting overlapping pixels or subtracting the expected image from the printed one. These methods operate by using the on-site machine vision system to capture images of the final product, and then comparing them with the desired reference. However, existing demonstrations include multistep image post-processing, which generates large data sets that are not easily handled in real time. Therefore, a major challenge still remains in the mass production of PE devices for obtaining in-line feedback on print quality to ensure consistent production quality.

Thanks to the non-destructive nature of terahertz (THz) light, which is generally defined between 100 GHz and 10 THz, and to its ability to penetrate through many optically opaque materials, such as plastic substrates, interest in THz time domain spectroscopy (THz-TDS) as a tool for quality control, as well as for non-invasive measurements, has increased considerably in recent years. Further, some innovative approaches use metamaterials to enhance the interaction with the media under test, and therefore improve the detected sensitivity. Since THz waves have submillimetre/ millimetre wavelengths, THz metamaterials have relatively large dimensions (e.g., in the hundreds of microns), and are easily printed with current PE technologies. Using this ability, a simple strategy using a printed control bar with resonance in the THz frequency range was recently proposed to probe the electrical conductivity in the production of PE devices. A key point of this strategy is the small printing area (<1 cm$^2$) required to extract the conductivity information of ink during the printing process. However, the quality and functionality of printed devices also depend on geometric specifications, such as the printing precision of the width and length of the conductive traces. Such accuracy is directly related to the distribution of applied ink. In graphic printing, a physical model of the dot gain shows the difference between the actual and expected ink dot sizes. This pattern is typically ~1 cm$^2$ and is printed away from the main production line to provide a response proportional to the overall ink distribution as a function of the printing parameters. For the manufacture of printable electronics products, print quality correction is mainly carried out off-site, and consists in printing, by trial and error, a larger or smaller structure and/or stretching or compressing the original image to achieve the desired result. Therefore, to date, no real-time feedback strategy has been developed for adjusting the print production of printable electronic devices.

In this example, the ability of THz-TDS was studied to track the printing accuracy and ink distribution of an industrial roll-to-roll press with the same physical model approach used in flexography. Fortuitously, the geometric properties of metamaterials strongly affect the transmission of an electromagnetic wave, through changes in its cell unit, lattice size and other geometric parameters, which is perfectly suited for this purpose. For this demonstration, two printing speeds and three geometric variations of the same pattern are used as feeding parameters. The method described herein uses the special electromagnetic transmission properties of a metallic checkerboard (MCB) pattern, which is made from conductive ink, and is rotated by 45°. The rotation geometry was chosen to allow investigating self-complementary structures exhibiting complementary transmission properties, i.e., for the X- and Y-directions, according to Babinet's principle. This phenomenon has been extensively studied for different frequencies, ranging from visible light to microwave radiation. MCB yields simultaneous information about the lattice and unit cell variations and allows investigating the influence of the printing speed on the resulting distribution accuracy of deposited ink. A self-complementary structure has the peculiarity of presenting a flat response when it is perfectly printed. Otherwise, a small modification of its unit cells near self-complementarity produces a unique resonant signature, which is highly suitable for tracking variations in printouts. Finally, to evaluate the ability of THz-TDS to follow the input printing parameters, the results presented herein were compared with those obtained from standard visible optical microscopy (OM).

Figures 13A, 13B, 13C:
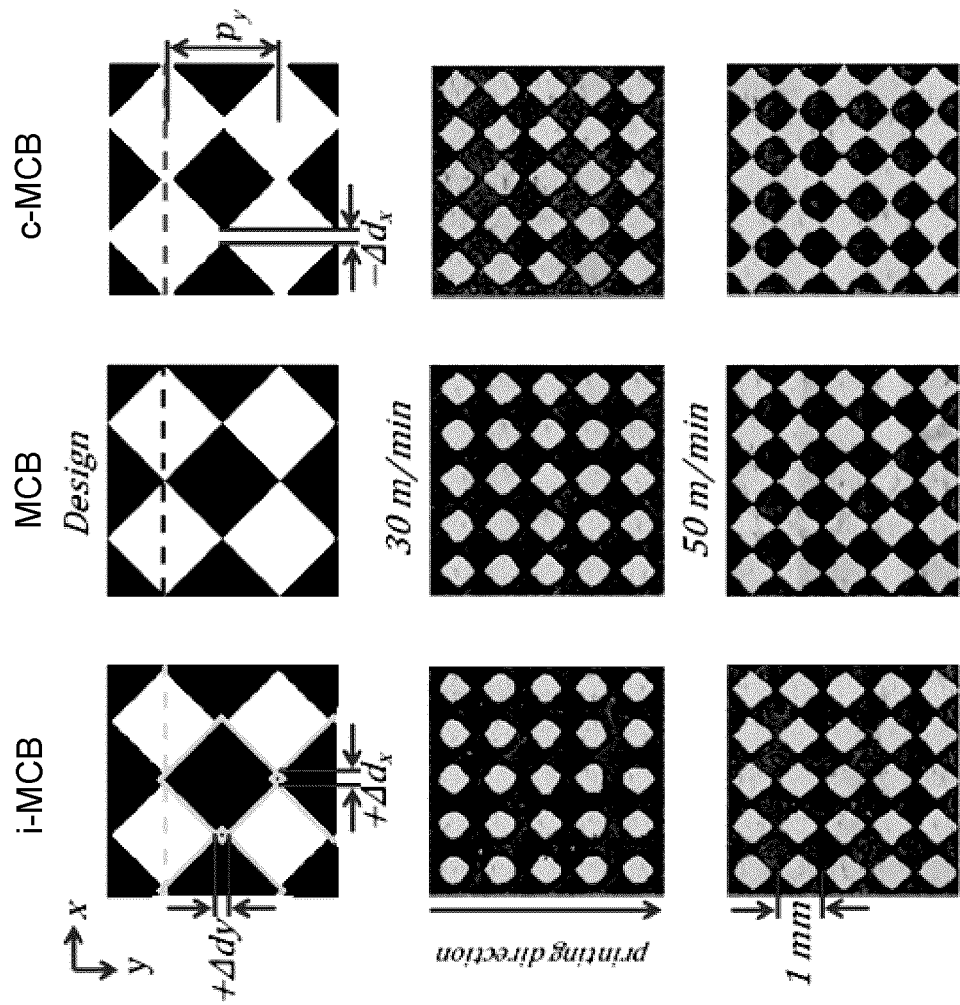
FIG. 13A includes three example metamaterial structures with different patterns of conductive elements interspersed with complementary insulating elements, with a left-hand side i-MCB pattern having an ink stretching of $\Delta d=+14$ μm, a middle MCB pattern having no ink stretching, and a right-hand side c-MCB pattern having an ink stretching of $\Delta d=-14$ μm, in accordance with one or more embodiments.
FIG. 13B includes images of the patterns of FIG. 13A printed at a linear speed of 30 m/min, in accordance with one or more embodiments.
FIG. 13C includes images of the patterns of FIG. 13A printed at a linear speed of 50 m/min, in accordance with one or more embodiments.

FIG. 13A illustrates the set of designed samples, which contains three structures: (i) an inductive MCB (i-MCB), (ii) a perfect MCB, and (iii) a capacitive MCB (c-MCB), as explained in greater detail in the methods section. The MCB is a self-complementary structure when c-MCB and i-MCB are complementary to each other. The designed structure was chosen to suit the spatial resolution characteristics of the printer. The predetermined period was the same in both directions $p=p_x=p_y=1$ mm and for all structures. The sizes of the ink's laps (+) or gaps (−) were varied between samples as follows: $\Delta d_{c\text{-}MCB}=-14$ μm, $\Delta d_{MCB}=0$ μm, $\Delta d_{i\text{-}MCB}=+14$ μm and were kept constant in the X- and Y-directions ($\Delta d_x=\Delta d_y$). These three structures were fabricated using silver water-based ink from SunChemical (Sun AFT6700) on the polyethylene terephthalate substrate (PET) with two different printed speeds: 30 m/min and 50 m/min. The production line was moving along the indicated Y-direction in FIGS. 13A-C. One quarter of the visible images of the two printed sets are shown in FIGS. 13B and 13C, respectively, where the black colour represents the printed metallic ink (metallic patches) and the whitish colour represents the substrate (voids). In FIGS. 13B and 13C, visible images of size 10.24×10.24 mm² and containing 4096×4096 pixels were obtained with a visible laser confocal microscope (model LEXT OLS4000), where 1 pixel corresponds to 2.5 μm.

From a simple visual observation of FIGS. 13A-C, it is clear that none of the printed structures in FIG. 13B or FIG. 13C correspond perfectly to the designed ones in FIG. 13A, where all metallic patches are much bigger, and voids smaller. The visual analysis also clearly reveals the changes in pattern shapes for the two printing speed conditions. At a slower printing speed, far away from the optimized press run rate, printing quality printability is suboptimal and printing conditions might be irregular. In the configuration press/ink/substrate, it appears that the ink tends to spread more, thus creating larger laps between each pattern. Meanwhile, increasing the print speed to approach optimal printing conditions gives better printability control and therefore produced patterns with sharper edges. Especially for c-MCB printed at 50 m/min (c-MCB50), it can be seen that the lap sizes are smaller, with some gaps appearing between patches. Besides, variations in the lattice could not be identified between all printed samples. Geometrical variation information provides an important insight into the printing performance, and is crucial for enabling the tuning of the desired final printed pattern. Theoretically, an accurate repetitive shape can be reached by seeking out the correct printing parameters. Here, it is to be noted that the goal of this example is not to find the ideal printing conditions for the production of the perfect structure, but rather, to precisely follow the printing variations.

For a more pragmatic assessment of the geometrical specifications of structures, Matlab software was used to count the number of black or white pixels in order to extract the sizes of the lattice ($p_x,p_y$) and laps/gaps ($\Delta d_x$, $\Delta d_y$) for the X- and Y-directions (see Supplementary FIG. 14 for more details).

FIG. 14 shows the image analysis strategy for optical microscopy measurements. In FIG. 14A, an example of a complete 4096×4096 pixel image for a sample of c-MCB50 is shown. The size of the gaps (−Δd) and laps (+Δd) between the metal patches in the X- and Y-directions were extracted using a Matlab algorithm. FIG. 14B shows an example of the gap (−$\Delta d_x$) and lap (+$\Delta d_y$) sizes, represented by the blue and red arrows, respectively. The blue and red shaded rectangular areas identify the extraction areas for tracking connection or disconnection sizes in the X- and Y-directions, respectively. For the identification of the lap size, the algorithm looks for the least narrow area between the metal parts and extracts the number of black pixels, which have been converted into the geometrical size of a lap. If there is a separation between patches, the white pixels between neighbouring patches are used for calculation of size of a gap. In addition, these shaded areas were used to calculate metal occupancy as a function of direction, as shown in FIG. 16 of the main article. The purpose of the evaluation of metal occupancy as a function of direction is to allow the identification of the printing behaviour for the X- and Y-directions separately. The procedure consists of counting the total number of black pixels framed in this rectangular area, which was then compared to the expected number of "ink" pixels. In FIGS. 14C and 14C, the histograms summarize the different types of connections: gaps and laps for both directions.

Figures 13D, 13E:
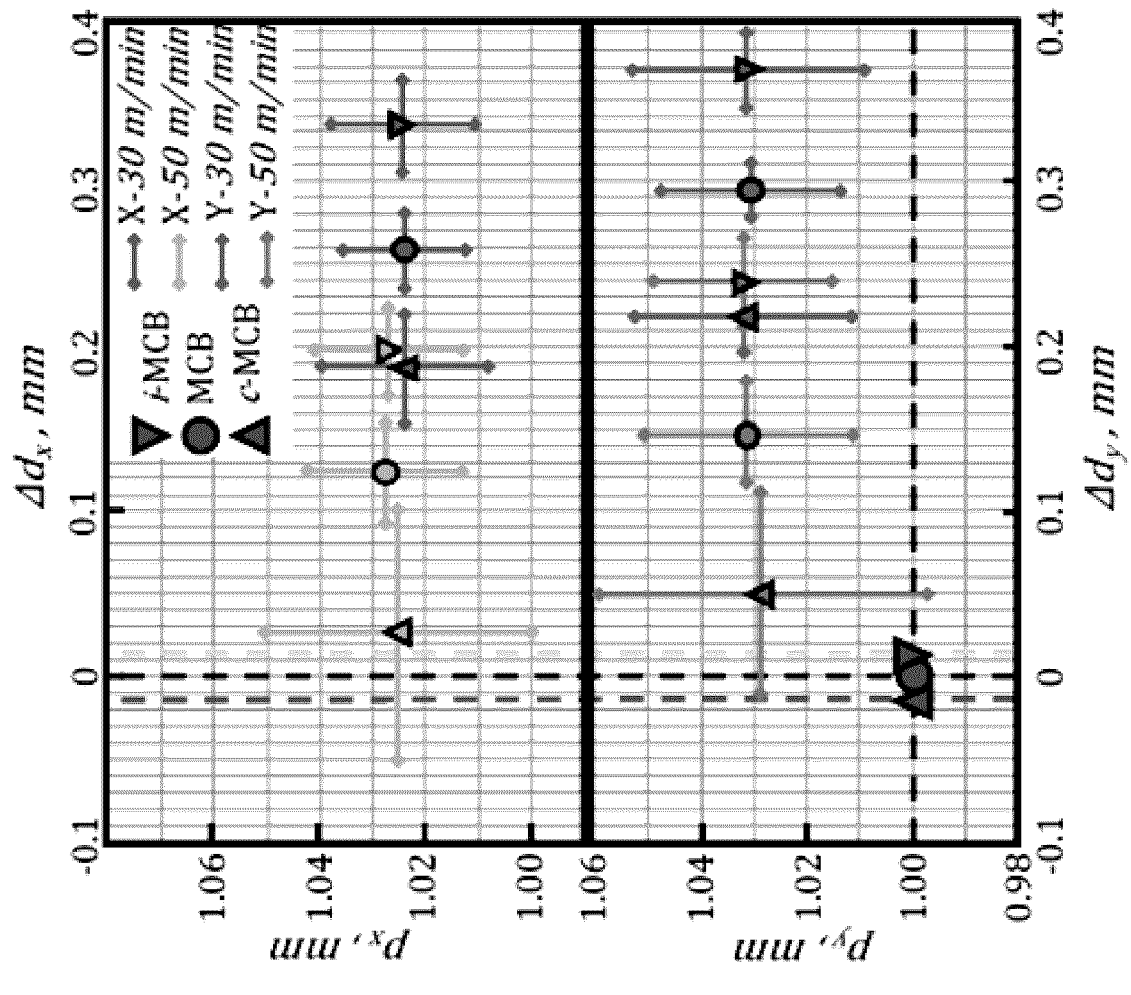
FIGS. 13D and 13E are graphs showing measured values of gaps Δd and lattices p of the patterns shown in FIGS. 13B and 13C, with horizontal and vertical lines showing a standard deviation obtained from measuring Δd and p of five replicas for each pattern, in accordance with one or more embodiments.
Figure 14A:
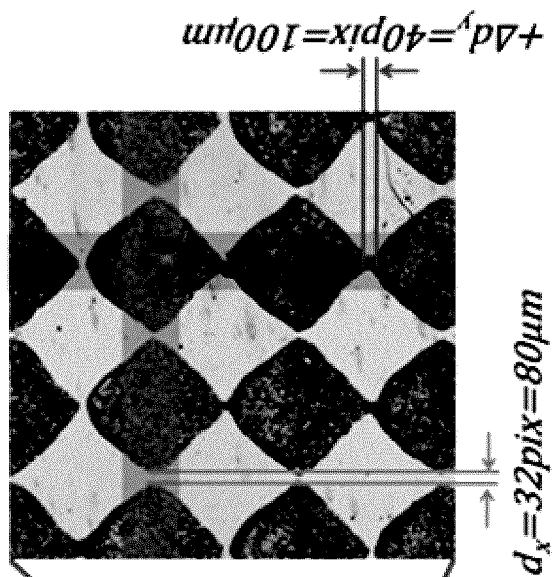
FIG. 14A is an image of some c-MCB patterns of FIG. 13A, with a geometrical size of 10.24 mm and 4096 pixels distributed therealong, in accordance with one or more embodiments.
Figure 14B:
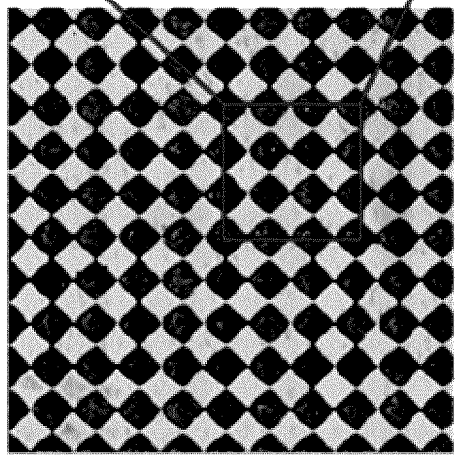
FIG. 14B is an enlarged view of the image of FIG. 14A.
Figure 14C:
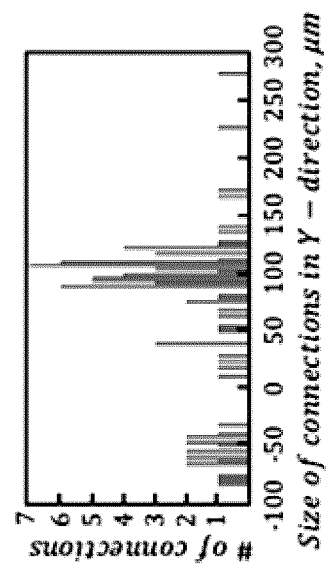
FIGS. 14C and 14D are histograms showing size of the connections between the conductive elements in the X- and Y-directions, in accordance with one or more embodiments.
Figure 14D:
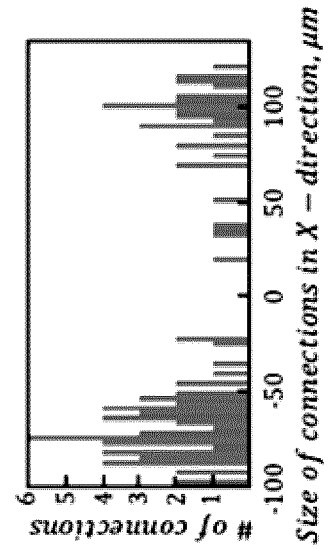

From five replicas printed for each structure, the standard deviation was used to recover the variation in printing accuracy. FIGS. 13D and 13E summarize the printing accuracy of the different structures and printing speeds, where the x-axis shows the size of laps/gaps and the lattice is plotted on the y-axis. The dashed lines correspond to the expected dimensions of the designed MCBs and the grid represents twice the spatial resolution limit of 5 μm. FIGS. 13D and 13E clearly confirm a simple visible observation, where slow printed samples have large bridges between patches, as compared to fast printing. These systematic assessments help in identifying the fact that printed patterns are not symmetric. There is always more ink in the Y-direction ($\Delta d_y$), which means that the size of the patch is bigger on the Y- versus X-axis. Importantly, in FIGS. 13D and 13E, a small difference induced in the lattice for the different patterns and printing speeds can be observed. As is shown in the figures, the lattice size is always bigger in the Y-direction than in the X-direction. The extension of the lattice and patch sizes in the Y-direction relative to the X-direction is in good agreement with the placement of the print sheet relative to the direction of the production line. In general, compared to printing in the X-direction, the Y-direction is stretched during production.

To summarize, a visual analysis with OM shows that the printing behaviour can be controlled and observed from tiny induced changes in the feeding parameters, i.e., between the 3 cases presented in FIGS. 13A i), ii) and iii). However, taking into account the large spatial variation of structures within a sample of about ±50 μm, optical microscopy allows differentiation of a change in printing on the order of 100 μm. For example, c-MCB's $\Delta d_x$ is 30±70 μm while MCB's $\Delta d_x$ is 125±30 μm. The second important conclusion that can be drawn is that the shape of printed patterns highly depends on the printing speed. For example, printing the patterns at a higher speed (50 m/min) produces shapes that are closer to the designed cases, but at the expense of a greater lattice and lap/gap size variability as compared to low printing speeds. In FIGS. 13D and 13E, the c-MCB50 contains laps and gaps, and is the closest printed pattern to the perfect MCB shape, which is represented by the vertical black dotted line. As is shown above using microscopy analysis, ink distribution information can be extracted by testing a small print area. However, OM can be difficult to implement for quality control in an industrial environment as it is subject to special conditions for correct observation, such as a stabilized imager.

The electromagnetic (EM) response of a metamaterial is controlled by the lattice and the dimensions of the unit cell comprising it. Generally, changing the geometrical specifications represents a way to tune and determine whether the EM wave is transmitted, reflected, or absorbed. Here, the designed MCBs behave as frequency selective filters, where an incident wavelength is approximately equal to one of the main dimensions of the unit cell (patch or voids), as well as to the lattice of the structure. Based on the geometrical parameters of the proposed patterns, a maximum THz transmission for the i-MCB should be around $f\Delta d_{i\text{-}MCB}$=0.22 THz, which corresponds to the size of the laps, and the first minimum THz transmission at $fp_{i\text{-}MCB}$=0.30 THz, which contains the lattice information. The i-MCB reveals a Fano-type resonance, where the transmission maximum is followed by a transmission minimum. According to Babinet's principle, the complementary of the i-MCB structure is the c-MCB structure, which must have reverse transmission properties at the same frequency. That means that there is a maximum THz transmission value (tending to 1) for i-MCB and a minimum THz transmission (close to 0) for c-MCB. In the case of a perfect MCB, there should be no resonance, i.e., the same transmission (0.5) at every frequency, where half power is transmitted and half power is reflected.

In FIG. 15A, to investigate EM responses in the Y- and X-directions, the samples were rotated at 90° while keeping the same THz polarization, as described in the methods section. Based on the OM observation in FIGS. 13B and 13C, all the printed samples contained mostly laps between each patch, and behave as i-MCB for EM light. However, due to the asymmetric printing behaviour for X- and Y-directions, different resonance responses as a function of lap size (i.e., between X- and Y-directions) were expected. To highlight the differences in printing behaviour for the X- and Y-laps, FIG. 15A illustrates the different possible structures, with a magnification of the gaps/laps sizes for better vision. The major printing behaviour found in the samples described herein is illustrated in FIG. 15A i), where laps in the Y-direction are bigger than those in the X-direction ($\Delta d_y > \Delta d_x$). Hence, according to previous work, a sharper Fano resonance shifts toward a higher frequency is expected as the size of the laps increases. This shift results in an increase in transmission amplitude at the expected resonance frequency. Inversely, a widening of the peak resonance frequency with a shift to a lower frequency will occur with a reduction of the lap size. Indeed, a decrease of the transmission value at the expected resonance frequency will occur in such a case. This latter situation is outlined in FIG. 15A ii), which corresponds to the interaction of an EM wave with c-MCB50 for the X-direction.

To ascertain the EM properties of the printed MCB, the normalized transmission responses were measured using the THz-TDS system (detailed in the methods section). FIGS. 15B and 15C present examples of the normalized THz spectra from the samples presented in FIGS. 13B and 13C, respectively. In these figures, a clear difference in THz transmission at the expected resonance frequency is found between the X- and Y-inspected directions, which agreed with the OM lap size observations in FIGS. 13A-C. For example, at a low printing speed for i-MCB (FIG. 15B), a small drop in transmission was observed at 0.22 THz, from the Y- to X-direction, indicating a reduction in the lap sizes. However, by printing at higher speeds, a drop in transmission can be noted, which is even more pronounced for the X- versus the Y-directions. By comparing FIG. 15B with FIG. 15C, a clear change of the transmission properties is observed between the different printing speeds, and see that it is in good agreement with OM measurements. On the other hand, the THz signature from the lattice remains unchanged at 0.27 THz, indicating that the variation of the lattice size was smaller than the spectral resolution of the THz system. It should be mentioned that for OM observations, a change in the lattice of less than 6 μm with a large standard deviation was found. Nevertheless, from these transmission spectra, the most interesting case is certainly FIG. 15C (c-MCB), where laps and gaps coexist. In this case, the normalized transmission of the peak resonant response decreased drastically from 0.95 to 0.65, which is closer to the perfect transmission case condition of 0.5. Despite the small induced differences in lap/gap sizes between the designed patterns, i.e., from $\Delta d_{i\text{-}MCB}$ of +14 μm to $\Delta d_{c\text{-}MCB}$ of −14 μm, THz-TDS transmission measurements have succeeded in identifying the impact of variation of the initial patterns on the printing behaviour.

Figures 15D, 15E:
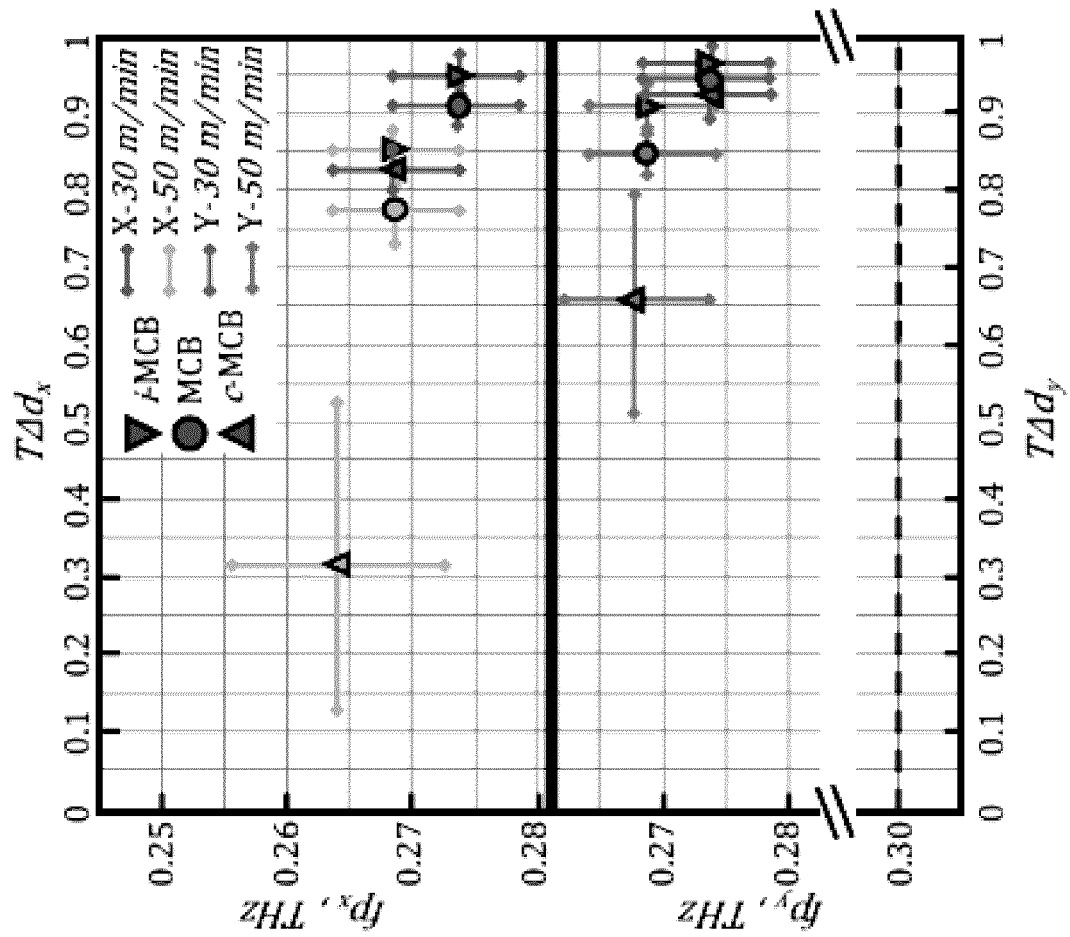
FIGS. 15D and 15E are graphs showing values of gaps Δd and lattices p of the patterns shown in FIGS. 15B and 15C measured using a THz-TDS measurement system, with horizontal and vertical lines showing a standard deviation obtained from measuring Δd and p of five replicas for each pattern, in accordance with one or more embodiments.

To better evaluate the accuracy of the THz transmission measurements, the same five replicas were investigated used for the OM investigation and summarize the THz results for the X- and Y-directions in FIGS. 15D and 15E, respectively. In the two figures, interest lies in the transmission values at 0.22 THz ($T\Delta d_{x,y}$), and in the frequency minima located close to 0.27 THz ($fp_{x,y}$), which provide information on the laps/gaps and lattice signatures, respectively. The transmissions for laps/gaps are shown on the x-axis, while the y-axis represents the frequency response from the lattice size. To allow a direct comparison with OM results, the y-axis is depicted in a decreasing frequency order. A larger lattice size exhibits a lower resonant frequency response, whereas a smaller size resonates in the higher frequency range. From FIGS. 15D and 15E, one can see that the lattice of the printed sample has a signature at a lower frequency than the design sample (depicted by the horizontal dashed line), which highlights the enlargement of the lattice, as was observed with OM. As with any other industrial tool, the printed electronic process is subject to great variations that continuously affect print quality. Here, the standard deviation of the THz results illustrates this existing condition as a function of the printing speed. In spite of these large variations, THz transmission, just like the OM results, allows a clear discrimination of the print quality according to the initial geometry of the print pattern. For example, in FIG. 15D, the largest standard deviation observed for $\Delta d_x$ is of the order of 20% over the normalized transmission value. Still, the THz data allows a greater discrimination between the c-MCB and MCB samples than that obtained by OM, i.e., a transmission of 0.32±0.2 for the c-MCB and 0.75±0.1 for the MCB. By calibrating these results with those obtained by OM: $\Delta d_x$ for c-MCB becomes 30±40 µm while $\Delta d_x$ for MCB is 125±20 µm. Given the 0.22 THz ($\lambda$=1.36 mm) electromagnetic wavelength used to probe this variation, this spatial resolution performance far exceeds the diffraction limit imposed by the Rayleigh criterion, confirming the remarkable ability of the method described herein to achieve super-resolution detection in a far-field regime.

Figures 16A, 16B, 16C:
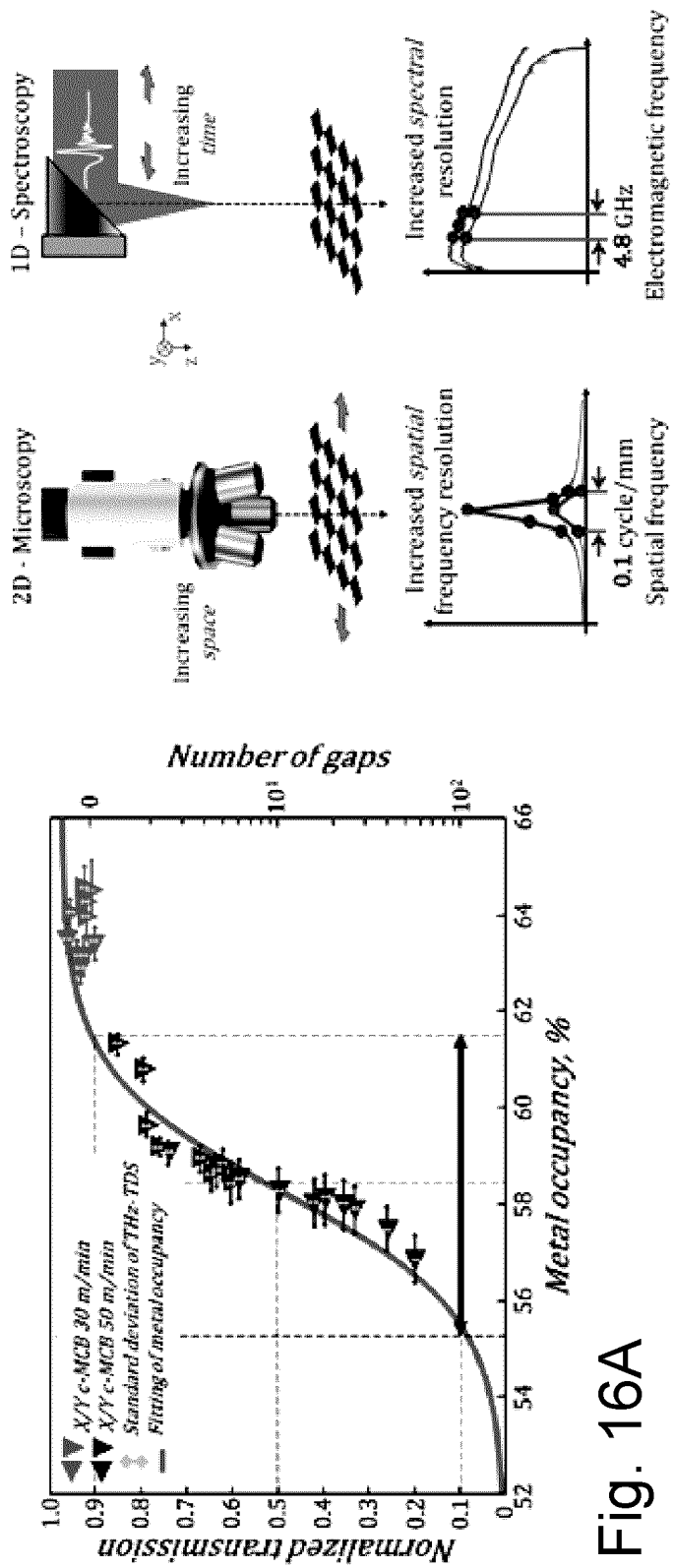
FIG. 16A is a graph showing normalized transmission as a function of metal occupancy, comparing optical microscopy and THz-TDS measurements, in accordance with one or more embodiments.
FIG. 16B includes a schematic view of an optical microscopy measurement system and associated spatial resolution, in accordance with one or more embodiments.
FIG. 16C includes a schematic view of a THz-TDS measurement system and associated spectral resolution, in accordance with one or more embodiments.

Intuitively, a large variation between similar samples should also mean a greater influence between the printed conditions and the THz transmission. To validate this hypothesis, the THz transmission behaviour of c-MCB samples was studied and compared to the obtained results with the percentage of metal occupancy revealed by OM observations. In FIG. 16, the THz transmission was evaluated for the X- and Y-directions of 14 samples, for a total of 28 measurements, with the same c-MCB print pattern. In this group of samples, five were printed at 30 m/min (the blue dots) and the rest at 50 m/min (the black dots). These results are plotted as a function of their metal occupancy rate measurements obtained by the OM method. Note that the metal occupancy (MO) depends on the amount of ink and its distribution, which for the MCB pattern, defines the number and sizes of gaps/laps. In that figure, the first striking observation is the growth of 10% to 90% in THz transmission, where the metal occupancy only changes from 55% to 61.5%. In addition, as it can be seen by the areas identified in dotted lines in FIG. 16A, a difference between the printing behaviours for the X- and Y-directions is easily discernible by the THz transmission measurement. This extreme sensitivity in THz response corresponds to the conversion of 60 gaps into laps, where the self-complementary transmission flipped from capacitive to inductive. As can be seen on the y-axis on the right side, a sample is composed of 100 gaps and perfectly follows a log scaling to match the observed transmission comportment.

Figure 17:
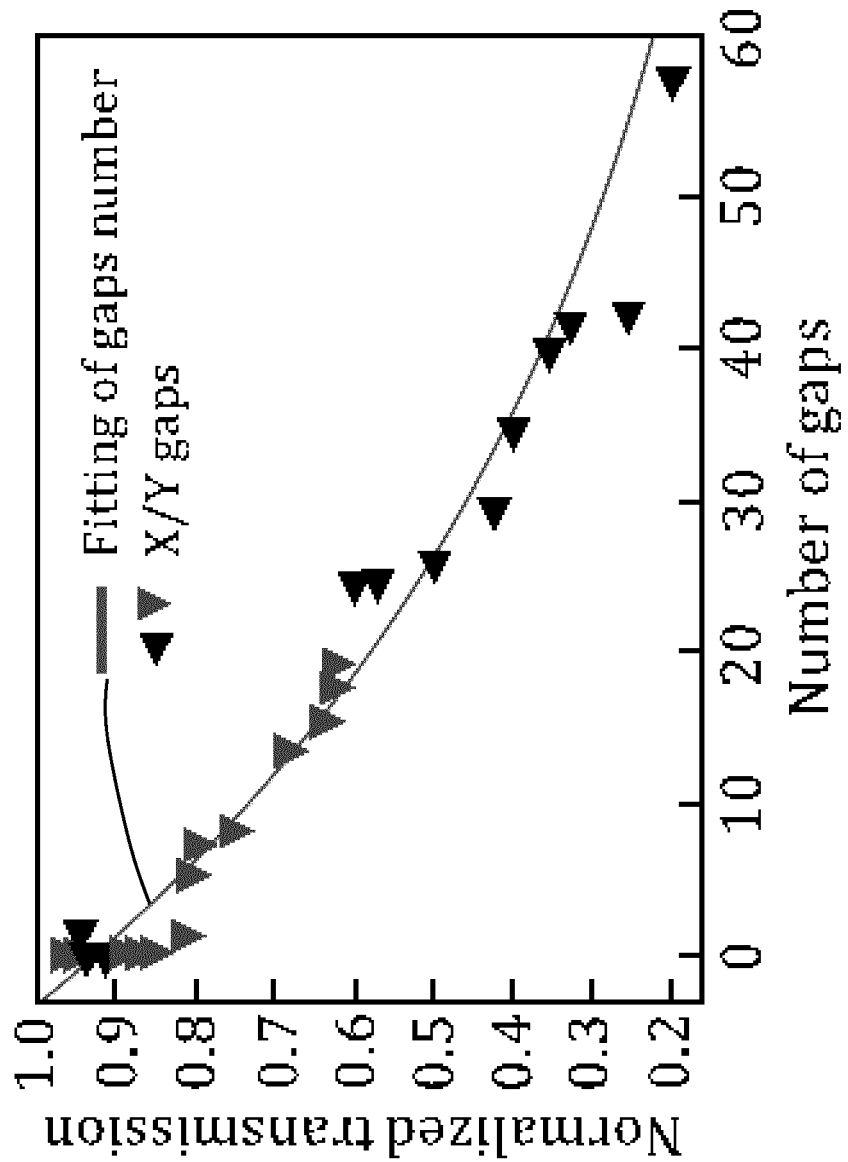
FIG. 17 is a graph of normalized transmission as a function of number of gaps measured by the optical microscopy system of FIG. 16B, showing an exponential behavior of the THz transmission as a function of the number of gaps, in accordance with one or more embodiments.

FIG. 17 shows the normalized transmission measurements in THz as a function of the number of gaps. It is important to mention that the presence of gaps has a greater impact on the transmission in THz than the presence of the lap. Nevertheless, when there are no more gaps in the MCB structure, the sensitivity of the THz transmission remains high enough to measure the variation in the size of the diamond due to variations in the size of the lap.

In FIG. 16A, the initial stage of growth is approximately exponential, and then the growth slows to linear, and finally stops. This tendency of the THz transmission T can be described by the so-called logistic function (S-curve) defined by:

$$blackT(MO) = \frac{L}{1 + e^{-k(MO - MO_0)}}, \quad (1)$$

where L shows the maximum transmission value (L=0.97), $MO_0$ is the S-curve midpoint, and k is the steepness of the curve (k=0.81). Here, the midpoint of the curve is 58.24%, which correspond to 0.5 in THz transmission. For the specific design of the MCB studied in this work, the midpoint at 58.24% defines a sensitivity range of 8% in the variation of metal occupancy, i.e., from 52% to 64%, as highlighted with the black arrow in FIG. 16A. Note that the sensitivity range and the midpoint can be modified by changing the parameters of the lattice and gap dimensions. Importantly, while the metal occupancy changes only for 8%, the terahertz transmission is varied through the entire range of sensitivity.

As can be observed in FIG. 16A, a transmission of 0.5 corresponds to 58.24% in metal occupancy, which is supposed to be for a perfect MCB case. However, this pattern contains 10 gaps out of 100 possible connections, and the rest includes laps with sizes up to 100 µm. Basically, a balanced transmission/reflection condition occurs when the transmission of the overlapped patches compensates those with gaps. In other words, the presence of gaps has a greater influence on THz transmission than does the presence of laps (see FIG. 17 for more details).

The relationship between space and time resolution in the example presented herein is quite appealing for quality control of printing conditions. It is well known that OM is designed to identify small elements. However, a larger field of view is required to achieve greater accuracy in order to resolve small changes in a structure that is periodic across positions in space, as illustrated in FIG. 16B. In the obtained measurements, the size of the image is limited to 10.24× 10.24 mm², which means that the spatial frequency resolution is inherently set to ~0.1 cycle/mm. For THz-TDS measurements, a scan duration of 204.8 ps long provides a spectral resolution of 4.8 GHz. As shown in this example, when combined with metamaterials and especially for self-complementary structures, the spectral resolution of a THz-TDS system is converted into spatial resolution capability (as shown in FIG. 16C). Basically, any improvement in spatial resolution is solely a function of the duration of the temporal scan (i.e., no additional space is required). Remarkably, under certain conditions, THz spectroscopy of metamaterials can operate as a super-resolution far-field THz microscope.

To sum up, the successful the printing behaviour of an industrial roll-to-roll press with flexography printing units was found for PE device production using the single point THz spectroscopy method. The strategy described herein employs the self-complementary transmission principle of a small ~10×10 mm² THz metamaterial. The THz information is able to track the geometrical accuracy and amount of ink of the printer with a similar level of precision as an optical microscope for visible light. In fact, 2D optical microscopy and 10 THz spectroscopy methods are in excellent agreement between each other. THz-TDS could be conveniently adopted for routine quality control of PE in industry, which should allow PE to maintain a required printing accuracy. These results pave the way for a remote characterization tool to probe the dimensional accuracy and could ultimately be used as feedback parameters for improving the overall printing performances in real time.

Figure 18:
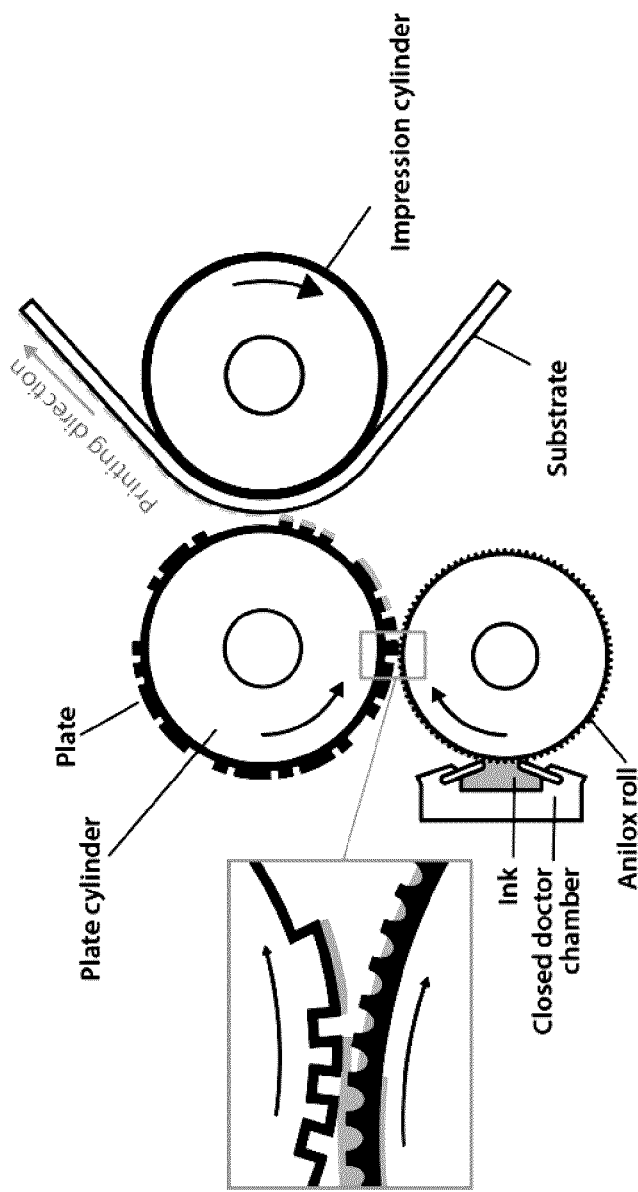
FIG. 18 is a schematic view of a flexographic press principle, with inked pattern being pressed against a polyethylene terephthalate substrate in a nip zone between a printing form and an impression cylinder, in accordance with one or more embodiments.

Samples were printed by an industrial roll-to-roll press with flexography printing units (OMET Varyflex V2) using a silver water-based ink from SunChemical (Sun AFT6700) with adjusted viscosity and drying retardant. As it is shown in FIG. 18, the ink is put in contact with a micro-engraved cylinder (Anilox), filling its cells, and is scraped with a doctor blade to assure that the cells are filled with a constant, controlled volume of ink at a rate of 12 billion cubic microns per square inch, which corresponds to 18.6 μm³/μm². The ink is then transferred onto a printing form, which defines the pattern information. The inked pattern is then pressed against the polyethylene terephthalate substrate in the nip zone between the printing form and an impression cylinder. The ink transfer on to the substrate is performed with the lowest possible pressure. The printing speed is varied between 30 m/min and 50 m/min.

Figure 19:
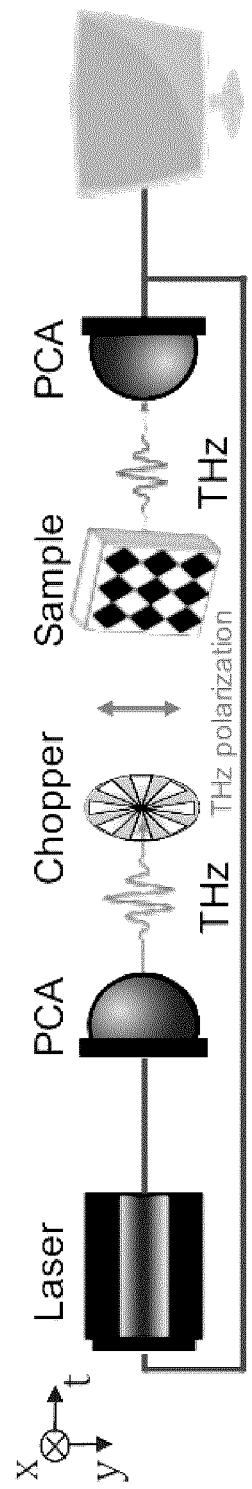
FIG. 19 is a schematic view of an example of a terahertz time-domain measurement system, showing photoconductive antennas generating and detecting terahertz waves in a transmission mode, in accordance with one or more embodiments.

The images were taken with a confocal laser microscope LEXT OLS4000 in stitching mode, with a 5× objective lens with a 2 Megapixel charged coupled device (CCD) camera. The THz-TDS setup was configured for spectroscopy in a transmission using an oscillator Ti: Sapphire laser (80 MHz, 400 mW, 810 nm, 40 fs) for pumping the commercial photoconductive antennas from Teravil used as emitter and detector, as shown FIG. 19. The PCA emitter and detector were placed in front of each other and a high resistivity hyper hemispherical silicon lens, located at the back of the emitter and detector, were used for fine alignment of the THz beam. To improve the dynamic range, the PCA detector was connected to a current amplifier (SR-5235) and a standard lock-in detection (SR-830) was performed with a mechanical chopper set at 330 Hz. The samples were placed between the mechanical chopper and the PCA detector at a normal incidence of vertically polarized THz pulses with a peak frequency of 0.2 THz (see FIG. 20 for more details).

Figure 20B:
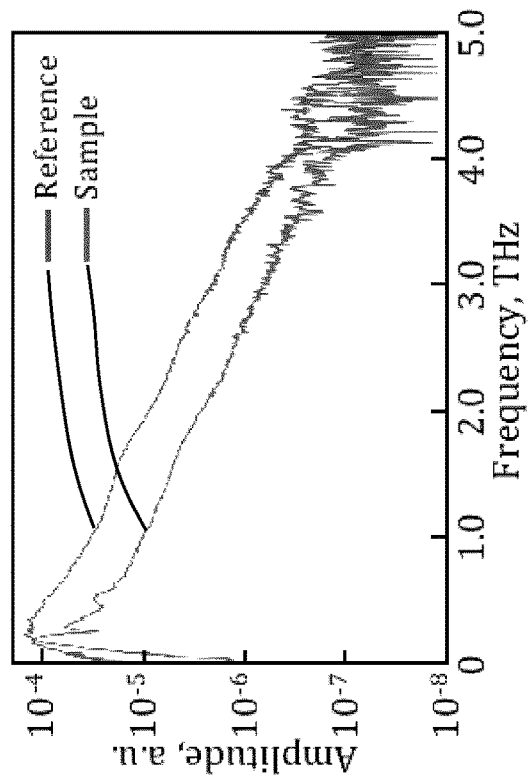
FIG. 20B is a graph showing amplitude as a function of frequency, obtained by performing a Fast Fourier Transform of the time traces presented in FIG. 20A, in accordance with one or more embodiments.
Figure 20A:
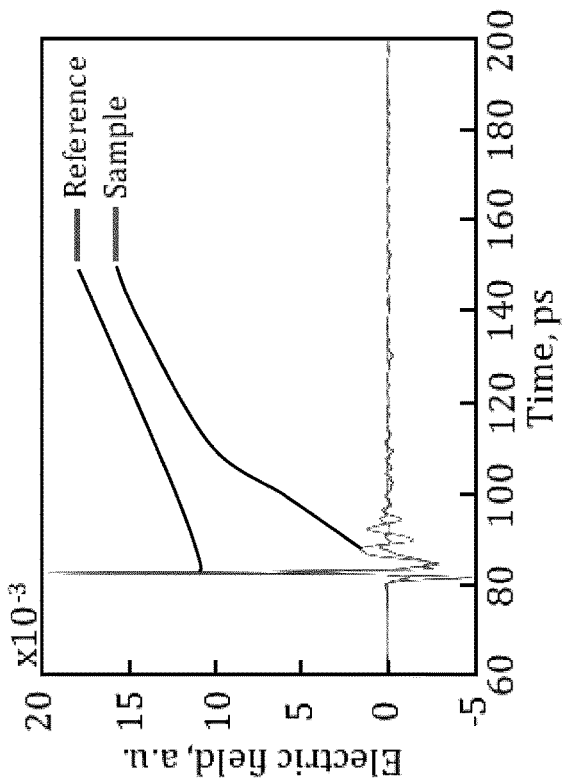
FIG. 20A is a graph showing electric field as a function of time as measured on a MCB pattern, in accordance with one or more embodiments.

FIG. 20A shows typical time traces for THz-TDS measurements. FIG. 20B shows the spectra obtained by the Fourier transform.

MCB was designed as a periodic structure, but due to the printing specifications, it has some irregularities, which have to be detected. To evaluate the variation of the size of laps/gaps and of the unit cell in the printing of MCB patterns, the images obtained were subjected to an appropriate post-processing analysis. The real image was processed with a combination of low-pass and high-pass filters to eliminate noise, and were then transformed into a binary image. All MCBs were rotated by 90° relative to the THz beam polarization to scan in the Y- and X-directions. The normalized transmission can be inferred from a measurement of two transmitted THz pulses propagating through a substrate ($E_{ref}(t)$) and through a sample ($E_{sam}(t)$) in the time domain. A ratio between the Fourier transform of the time-domain reference ($E_{ref}(\omega)$) and sample ($E_{sam}(\omega)$) waveforms give the sample's normalized transmission: $T=E_{sam}(\omega)/E_{ref}(\omega)$.

Figure 21:
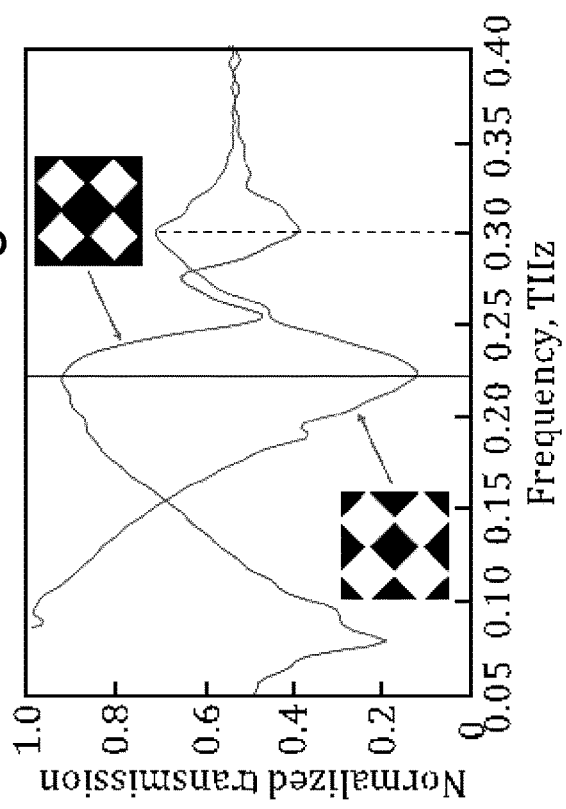
FIG. 21 is a graph showing normalized transmission as a function of frequency for extrema examples of i-MCB and c-MCB patterns, in accordance with one or more embodiments.

The finite-difference time-domain method using a linear polarized light and a periodic boundary condition were used for the simulation of the expected transmission of i-MCBs and c-MCBs with varied voids (see FIG. 21 for more details).

FIG. 21 shows the results from simulation using Finite Difference Time-Domain (FDTD) software from Lumerical. In that figure, the red curve corresponds to the c-MCB and the blue curve to the i-MCB. The black line at 0.22 THz indicates where the normalized transmission value were extracted for different gaps and lap sizes. The dashed line at 0.3 THz represents the designed MCB lattice.

As can be understood, the examples described above and illustrated are intended to be exemplary only. For instance, the printed electronic device can by any suitable type of electronic device including, but not limited to, flexible displays, curved smartphones, blood glucose tests, antennas, freshness sensors, solar cells, e-boards and the like. Moreover, the printing techniques can include, but not limited to, screen printing, flexography printing, gravure printing, offset lithography printing, inkjet printing, digital aerosol jet printing, laser printing, electrohydrodynamic jet printing, sintering (e.g., thermal sintering, laser sintering, UV sintering) and the like. It is noted that although in some embodiments described above the terahertz radiation beam is a pulsed terahertz radiation beam, the terahertz radiation beam can be a continuous wave (CW) terahertz radiation beam in some other embodiments. In some embodiments, the terahertz radiation beam may be monochromatic whereas the terahertz radiation beam can be broadband in some other embodiments. In view of the above, any satisfactory terahertz radiation beam may be used depending on the embodiment. The scope is indicated by the appended claims.

What is claimed is:

1. A method of assessing an ink deposition accuracy in an electronic device printing process, the method comprising:
   printing a metamaterial structure on a substrate using conductive ink, the metamaterial structure having a pattern of conductive elements interspersed with complementary insulating elements, the metamaterial structure having at least a terahertz resonance frequency;
   emitting a terahertz radiation beam incident on the metamaterial structure of the substrate, the incident terahertz radiation beam having power at least at the terahertz resonance frequency of the metamaterial structure;
   the metamaterial structure interacting with said incident terahertz radiation beam resulting in an outgoing terahertz radiation beam having a spectral response at least at the terahertz resonance frequency;
   measuring said spectral response of said outgoing terahertz radiation beam;
   assessing an ink deposition accuracy of said printing based on said measured spectral response; and
   generating a signal based on said assessed ink deposition accuracy.

2. The method of claim 1 wherein said ink deposition accuracy is assessed to be unsatisfactory upon determining that said spectral response is resonant.

3. The method of claim 1 wherein said ink deposition accuracy indicates that too much conductive ink was used in said printing upon determining that said spectral response is inductive.

4. The method of claim 1 wherein said ink deposition accuracy indicates that not enough conductive ink was used in said printing upon determining that said spectral response is capacitive.

5. The method of claim 1 wherein said ink deposition accuracy is assessed to be satisfactory upon determining that said spectral response is non-resonant.

6. The method of claim 1 wherein said metamaterial structure has a coordinate system comprising first and second axes being orthogonal to one another and coplanar with said substrate, wherein said measuring comprises measuring first and second polarization components of said spectral response of said outgoing terahertz radiation beam, said first and second polarization components being polarized along a respective one of said first and second axes of said coordinate system.

7. The method of claim 6 wherein said assessed ink deposition accuracy has a first ink deposition accuracy associated to said printing along said first axis and a second ink deposition accuracy associated to said printing along said second axis.

8. The method of claim 6 wherein said ink deposition accuracy is assessed to be unsatisfactory upon finding a non-null spectral shift between said first and second polarization components.

9. The method of claim 1 wherein said conductive elements and said insulating elements collectively form a checkerboard-like pattern on said substrate.

10. The method of claim 1 wherein said conductive elements cover an area which corresponds to an area covered by said insulating elements.

11. The method of claim 1 wherein said assessing comprises comparing said measured spectral response to a reference spectral response, the reference spectral response being indicative of an interaction between a reference terahertz radiation beam and a reference metamaterial structure being satisfactorily printed using on a substrate.

12. The method of claim 1 wherein said printing is performed according to a printing parameter, the method further comprising modifying said printing parameter upon assessing that the ink deposition accuracy is unsatisfactory.

13. The method of claim 1 wherein said printing the metamaterial structure is performed according to a printing parameter, the substrate having an electronic circuit printed on a given area of the substrate according to the printing parameter, the method further comprising associating said assessed ink deposition accuracy to said printed electronic circuit.

14. An electronic device testing system for testing an electronic device having a substrate on which is printed a metamaterial structure using a conductive ink, the metamaterial structure having a pattern of conductive elements interspersed with complementary insulating elements, the metamaterial structure having at least a terahertz resonance frequency, the electronic device testing system comprising:
   a terahertz radiation emitter emitting a terahertz radiation beam incident on the metamaterial structure of the substrate, the incident terahertz radiation beam having power at least the terahertz resonance frequency of the metamaterial structure, the metamaterial structure interacting with said incident terahertz radiation beam resulting in an outgoing terahertz radiation beam having a spectral response at least at the terahertz resonance frequency;
   a terahertz radiation receiver receiving the outgoing terahertz radiation beam outgoing and measuring said spectral response at least at the terahertz resonance frequency; and
   a controller communicatively coupled to the terahertz radiation receiver, the controller having a processor and a memory having stored thereon instructions that when executed by the processor perform the step of: assessing an ink deposition accuracy of said printing based on said measured spectral response; and generating a signal based on said assessed ink deposition accuracy.

15. The electronic device testing system of claim 14, wherein the terahertz radiation emitter is a broadband terahertz radiation emitter, the terahertz radiation receiver measuring a spectral power distribution of at least a portion of the outgoing terahertz radiation beam, the system further comprising a broadband terahertz radiation reference receiver measuring a spectral power distribution of a portion of the incident terahertz radiation beam, the controller performing said assessing based the spectral power distributions of the incident terahertz radiation beam and of the outgoing terahertz radiation beam.

16. The electronic device testing system of claim 14 wherein the terahertz radiation emitter is a broadband terahertz radiation emitter, the terahertz radiation receiver measuring a spectral power distribution of the outgoing terahertz radiation beam, the controller performing said assessing based on a first spectral region of said spectral response and on a second spectral region of said spectral response, the first and second spectral regions being spectrally different from one another.

17. An electronic device production system comprising:
   an electronic device printing system receiving a substrate, printing an electronic circuit on a given area of the substrate using a conductive ink and printing a metamaterial structure on a remaining area of the substrate using the conductive ink, the metamaterial structure having a pattern of conductive elements interspersed with complementary insulating elements, the metamaterial structure having at least a terahertz resonance frequency; and
   an electronic device testing system receiving the previously printed substrate, the electronic device testing system comprising a terahertz radiation emitter emitting a terahertz radiation beam incident on the metamaterial structure of the substrate, the incident terahertz radiation beam having power at least at the terahertz resonance frequency of the metamaterial structure, the metamaterial structure interacting with said incident terahertz radiation beam resulting in an outgoing terahertz radiation beam having a spectral response at least at the terahertz resonance frequency; a terahertz radiation receiver receiving the outgoing terahertz radiation beam and measuring said spectral response; and
   a controller communicatively coupled to the terahertz radiation receiver, the controller having a processor and a memory having stored thereon instructions that when executed by the processor perform the step of: assessing an ink deposition accuracy of said printing based on said measured spectral response; performing an action upon determining that said assessed ink deposition accuracy is unsatisfactory.

18. The electronic device production system of claim 17 wherein said action includes generating a file indicating that the electronic device has been printed with an unsatisfactory ink deposition accuracy.

19. The electronic device production system of claim 17 wherein said action includes modifying at least a printing parameter of said electronic device printing system.

20. The electronic device production system of claim 19 wherein said action includes one of partially and wholly reprinting the electronic circuit of the electronic device after said modifying.

* * * * *